United States Patent
Yang et al.

(10) Patent No.: US 8,343,638 B2
(45) Date of Patent: Jan. 1, 2013

(54) ORGANIC LIGHT EMITTING DIODE INCLUDING LIGHT-EFFICIENCY-IMPROVEMENT LAYER

(75) Inventors: Seung-Gak Yang, Yongin (KR); Hee-Yeon Kim, Yongin (KR); Jae-Yong Lee, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 491 days.

(21) Appl. No.: 12/543,334

(22) Filed: Aug. 18, 2009

(65) Prior Publication Data

US 2010/0039029 A1 Feb. 18, 2010

(30) Foreign Application Priority Data

Aug. 18, 2008 (KR) .................. 10-2008-0080567

(51) Int. Cl.
*H01L 51/54* (2006.01)
*C09K 11/06* (2006.01)

(52) U.S. Cl. ........ 428/690; 428/917; 313/502; 313/504; 548/100

(58) Field of Classification Search ................ None
See application file for complete search history.

(56) References Cited

U.S. PATENT DOCUMENTS

| | | | |
|---|---|---|---|
| 6,737,800 B1 | 5/2004 | Winters et al. | |
| 7,622,584 B2 | 11/2009 | Kim et al. | |
| 2007/0104977 A1 | 5/2007 | Arakane et al. | |
| 2007/0120453 A1* | 5/2007 | Hwang et al. | 313/112 |
| 2007/0222368 A1 | 9/2007 | Lee et al. | |
| 2008/0125593 A1* | 5/2008 | Kim et al. | 546/85 |
| 2008/0226945 A1* | 9/2008 | Kim et al. | 428/704 |

FOREIGN PATENT DOCUMENTS

| | | |
|---|---|---|
| EP | 1 925 618 A1 | 5/2008 |
| KR | 2007-0095555 | 10/2007 |
| KR | 10-0852118 | 8/2008 |
| KR | 10-0903102 B1 | 6/2009 |
| WO | WO 2006054137 A1 * | 5/2006 |

OTHER PUBLICATIONS

KIPO Office action dated Oct. 11, 2010 issued in Korean priority application No. 10-2008-0080567, listing the foreign references and US 2007/0104977 A1, (5 pages).

European Search Report dated Dec. 7, 2009, for corresponding European application 09252012.1.

Zhu, Z., et al., *High Performance Top-Emitting White Organic Light-Emitting Devices*, Japanese Journal of Applied Physics, vol. 47, No. 7A, (2007), pp. 4054-4058, XP-001517970.

Wang, L., et al.,*Research on the adhesive ability between ITO anode and PET substrate improved by polyimide buffer layer*, Chinese Science Bulletin, vol. 50, No. 6, Mar. 2005, pp. 605-608, XP-002555403.

\* cited by examiner

*Primary Examiner* — Jennifer Chriss
*Assistant Examiner* — Andrew K Bohaty
(74) *Attorney, Agent, or Firm* — Christie, Parker & Hale, LLP

(57) ABSTRACT

An organic light emitting diode is disclosed, and includes a light-efficiency-improvement layer containing a compound represented by Formula 1:

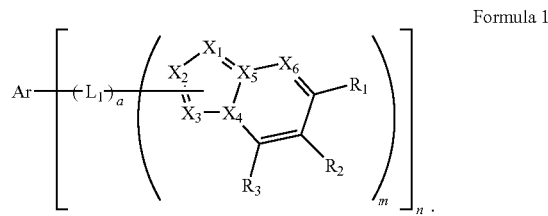

Formula 1

22 Claims, 1 Drawing Sheet

ORGANIC LIGHT EMITTING DIODE INCLUDING LIGHT-EFFICIENCY-IMPROVEMENT LAYER

CROSS-REFERENCE TO RELATED PATENT APPLICATIONS

This application claims priority to and the benefit of Korean Patent Application No. 10-2008-0080567, filed in the Korean Intellectual Property Office on Aug. 18, 2008, the entire content of which is incorporated herein by reference.

FIELD OF THE INVENTION

The present invention relates to an organic light emitting diode including a light-efficiency-improvement layer.

BACKGROUND OF THE INVENTION

Organic light emitting diodes are self-emission devices. Organic light emitting diodes have wide viewing angles, high contrast ratios, quick response speeds, excellent luminescent characteristics, low driving voltages, and excellent colorizing characteristics.

In general, an organic light emitting diode includes a substrate, an anode disposed on the substrate, a hole transport layer, an emission layer, an electron transport layer and a cathode, which are sequentially disposed on the anode in this order. Herein, the hole transport layer, the emission layer and the electron transport layer are organic thin films.

An operational principle of the organic light emitting diode will now be described in detail.

When voltage is applied between the anode and the cathode, holes injected from the anode move to the emission layer through the hole transport layer and electrons injected from the cathode move to the emission layer through the electron transport layer. The holes and electrons which are carriers are recombined in the emission layer, thereby generating exitons. The exitons are transited from an excited state to a ground state, thereby generating light.

Light efficiency of organic light emitting diodes can be categorized into internal luminescent efficiency and external luminescent efficiency. Internal luminescent efficiency relates to how efficiently exitons are generated in an organic layer interposed between a first electrode and a second electrode, that is, between the anode and the cathode and light is converted, wherein the organic layer may be a hole transport layer, an emission layer, or an electron transport layer. External luminescent efficiency (hereinafter also referred to as light coupling efficiency) relates to how efficiently light generated in the organic layer is emitted outside the organic light emitting diode. Accordingly, even if the organic layer has high light conversion efficiency, that is, the internal luminescent efficiency is high, when the light coupling efficiency is low, the whole light efficiency of the organic light emitting diode may be decreased.

SUMMARY OF THE INVENTION

The present invention provides an organic light emitting diode that has improved light efficiency.

According to an aspect of the present invention, an organic light emitting diode is provided that includes: a substrate; a first electrode disposed on the substrate; an organic layer disposed on the first electrode; a second electrode disposed on the organic layer; and a light-efficiency-improvement layer, wherein the first electrode has a first surface contacting with the organic layer and a second surface being opposite to the organic layer, the second electrode has a first surface contacting with the organic layer and a second surface being opposite to the organic layer, and the light-efficiency-improvement layer is formed on at least one of the second surface of the first electrode and the second surface of the second electrode and comprises a compound represented by Formula 1:

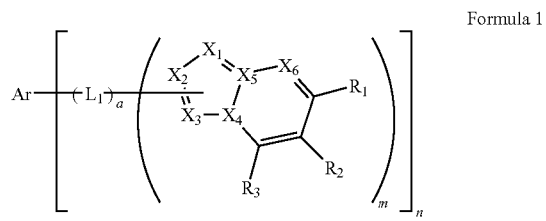

Formula 1 where Ar is a substituted or unsubstituted $C_5$-$C_{30}$ aromatic ring system or a substituted or unsubstituted $C_2$-$C_{30}$ hetero aromatic ring system; $L_1$ is a substituted or unsubstituted $C_1$-$C_{30}$ alkylene group, a substituted or unsubstituted $C_5$-$C_{30}$ arylene group, or a substituted or unsubstituted $C_2$-$C_{30}$ hetero arylene group; $X_1$ is N, $CY_1$, or a binding site with $L_1$ or Ar, $X_2$ is N, $CY_2$, or a binding site with $L_1$ or Ar, $X_3$ is N, $CY_3$, or a binding site with $L_1$ or Ar, $X_4$ is N, $CY_4$, or a binding site with $L_1$ or Ar, $X_5$ is N, $CY_5$, or a binding site with $L_1$ or Ar, and $X_6$ is N, $CY_6$, or a binding site with $L_1$ or Ar, wherein any one of $X_1$ through $X_6$ is a binding site with $L_1$ or Ar; each of $R_1$ through $R_3$ and $Y_1$ through $Y_6$ is independently selected from a hydrogen atom, a halogen atom, a hydroxyl group, a cyano group, substituted or unsubstituted $C_1$-$C_{30}$ alkyl groups, substituted or unsubstituted $C_1$-$C_{30}$ alkoxy groups, substituted or unsubstituted $C_1$-$C_{30}$ acyl groups, substituted or unsubstituted $C_2$-$C_{30}$ alkenyl groups, substituted or unsubstituted $C_2$-$C_{30}$ alkynyl groups, substituted or unsubstituted $C_5$-$C_{30}$ aryl groups, or substituted or unsubstituted $C_2$-$C_{30}$ hetero aryl groups, wherein two or more adjacent elements selected from $R_1$ through $R_3$ and $Y_1$ through $Y_6$ are bonded to each other to form a saturated or unsaturated ring; a is an integer of 0 through 10; m is an integer of 1 through 5; and n is an integer of 1 through 10.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

Figure 1:
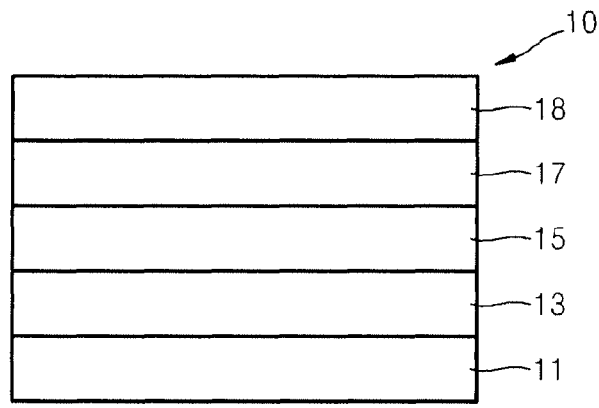
FIG. 1 is a schematic view of an organic light emitting diode according to an embodiment of the present invention.

FIG. 1 is a schematic view of an organic light emitting diode (OLED) 10 according to an embodiment of the present invention.

Referring to FIG. 1, the OLED 10 according to the present embodiment includes a substrate 11, a first electrode 13, an organic layer 15, a second electrode 17, and a light-efficiency-improvement layer 18, which are sequentially formed in this order. The second electrode 17 may be a transmission-type electrode, and light generated in the organic layer 15 is emitted outside the organic light emitting diode 10 through the second electrode 17 and the light-efficiency-improvement layer 18.

The substrate 11 may be any substrate that is used in a conventional organic light emitting diode. In this regard, the substrate 11 may be a glass or transparent plastic substrate that has mechanical strength, thermal stability, a flat surface, convenience for handling, is transparent, and is waterproof.

The first electrode 13 may be formed by depositing or sputtering a first electrode forming material on the substrate 11. The first electrode 13 has a first surface contacting the organic layer 15 and a second surface opposite the organic layer 15. When the first electrode 13 is an anode, the first electrode forming material may be selected from materials having a high work function so that holes are easily injected. The first electrode 13 may be a reflection-type electrode or a transmission-type electrode. The first electrode forming material may be a transparent, conductive material, such as indium tin oxide (ITO), indium zinc oxide (IZO), thin oxide ($SnO_2$), or zinc oxide (ZnO). When the first electrode 13 is a reflection-type electrode, the first electrode forming material may be magnesium (Mg), aluminum (Al), aluminum-lithium (Al—Li), calcium (Ca, magnesium-indium (Mg—In), or magnesium-silver (Mg—Ag).

The organic layer 15 may be disposed on the first electrode 13. In the current specification, the term "organic layer" refers to a layer interposed between the first electrode 13 and the second electrode 17, and the organic layer may include materials other than purely organic materials. In this regard, the organic layer can also include a metal complex.

The organic layer 15 may include at least one layer selected from the group consisting of a hole injection layer (HIL), a hole transport layer (HTL), an emission layer (EML), a hole blocking layer (HBL), an electron transport layer (ETL), and an electron injection layer (EIL).

An HIL may be formed on the first electrode 13 using any known method, such as a vacuum-deposition method, a spin-coating method, a casting method, or a Langmuir-Blodgeft (LB) deposition method.

If the HIL is formed using the vacuum-deposition method, deposition conditions may differ according to an HIL forming material, the target layer structure, and thermal characteristics. In this regard, in general, the deposition temperature may be 100 to 500° C, the vacuum deposition pressure may be $10^{-8}$ to $10^{-3}$ torr, and the deposition rate may be 0.01 to 100 Å/sec.

If the HIL is formed using the spin-coating method, coating conditions may differ according to the HIL forming material, the target layer structure, and thermal characteristics. In this regard, in general, the coating rate may be about 2000 rpm to 5000 rpm, and the heat treatment temperature at which solvent is removed after coating may be about 80° C. to 200° C.

The HIL forming material may be any known hole injectable material. Examples of the hole injectable material include: a phthalocyanine compound such as copper phthalocyanine; 4,4',4"-tris (3-methylphenylphenylamino) triphenylamine (m-MTDATA) illustrated below; N,N'-di(1-naphthyl)-N,N'-diphenylbenzidine (NPB); TDATA illustrated below; 2T-NATA illustrated below; polyaniline/dodecylbenzenesulfonic acid (Pani/DBSA); poly(3,4-ethylenedioxythiophene)/poly(4-styrenesulfonate) (PEDOT/PSS); polyaniline/camphor sulfonicacid (Pani/CSA); and (polyaniline)/poly(4-styrenesulfonate) (PANI/PSS). However, the HIL forming material is not limited to these materials.

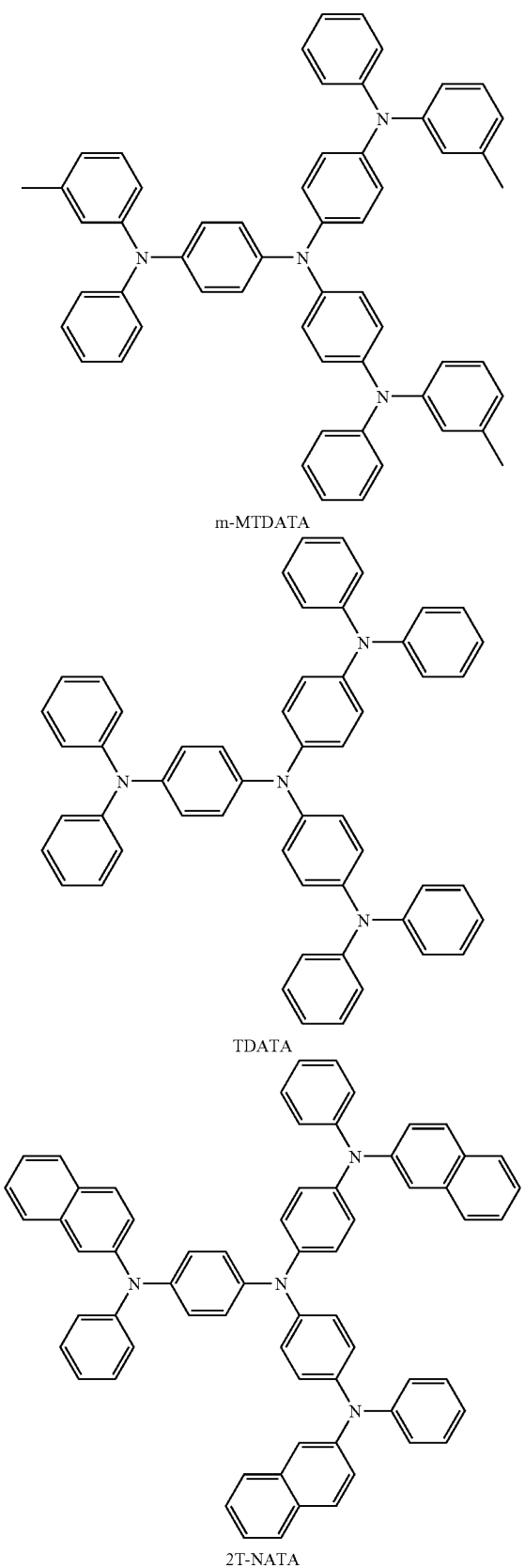

m-MTDATA

TDATA

2T-NATA

In an embodiment, the thickness of the HIL may be about 100 Å to 10000 Å. In another embodiment, the thickness may be 100 Å to 1000 Å. If the thickness of the HIL is within this range, appropriate hole injection characteristics may be obtained without a substantial increase in the driving voltage.

Then an HTL may be formed on the HIL using any known method, such as a vacuum-deposition method, a spin-coating method, a casting method, or an LB deposition method. When the HTL is formed using the vacuum-deposition method or the spin-coating method, deposition conditions and coating conditions may differ according to an HTL forming material. In this regard, deposition conditions and coating conditions may be the same or similar to those described with reference to the HIL.

The HTL forming material may be any known hole transportable material. Examples of the hole transportable material include: a carbazole derivative such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD) illustrated below or N,N'-di(naphthalene-1-yl)-N,N'-diphenyl benzidine (α-NPD) illustrated below; and a triphenylamine-based material, such as 4,4',4"-tris(N-carbazolyl)triphenylamine(4,4',4"-tris(N-carbazolyl)triphenylamine) (TCTA). Specifically, TCTA may have, in addition to a hole transporting capability, a capability of blocking diffusion of exitons generated in the EML.

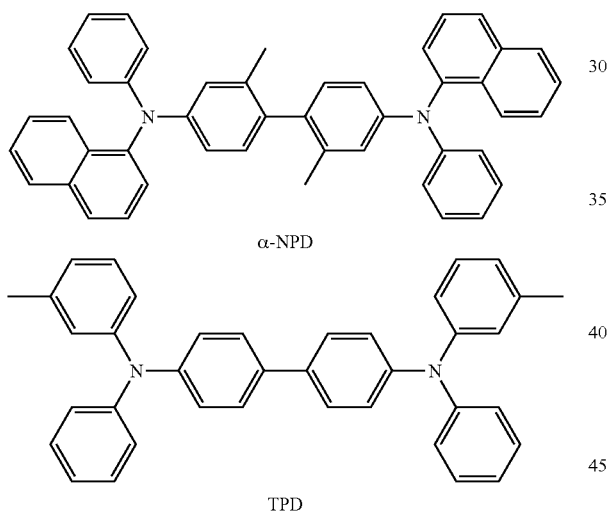

α-NPD

TPD

In an embodiment, the thickness of the HTL may be about 50 Å to 1000 Å. In another embodiment, the thickness may be 100 Å to 800 Å. If the thickness of the HTL is within this range, appropriate hole transporting characteristics can be obtained without a substantial increase in the driving voltage.

Then an EML may be formed on the HTL using any known method, such as a vacuum-deposition method, a spin-coating method, a casting method, or an LB deposition method. When the EML is formed using the vacuum-deposition method or the spin-coating method, deposition conditions and coating conditions may differ according to an EML forming material. In this regard, deposition conditions and coating conditions may be the same or similar to those described with reference to the HIL.

The EML may include a compound or a combination of a host and a dopant.

Examples of the host include $Alq_3$, 4,4'-N,N'-dicarbazole-biphenyl (CBP), poly(n-vinylcarbazole) (PVK) illustrated below, 9,10-di(naphthalene-2-yl)anthracene (ADN) illustrated below, TCTA, 1,3,5-tris( N-phenylbenzimidazole-2-yl)benzene(1,3,5-tris(N-phenylbenzimidazole-2-yl) benzene) (TPBI) illustrated below, 3-tert-butyl-9,10-di(naphth-2-yl) anthracene (TBADN) illustrated below, E3 illustrated below, and distyrylarylene (DSA). However, the host is not limited to these materials.

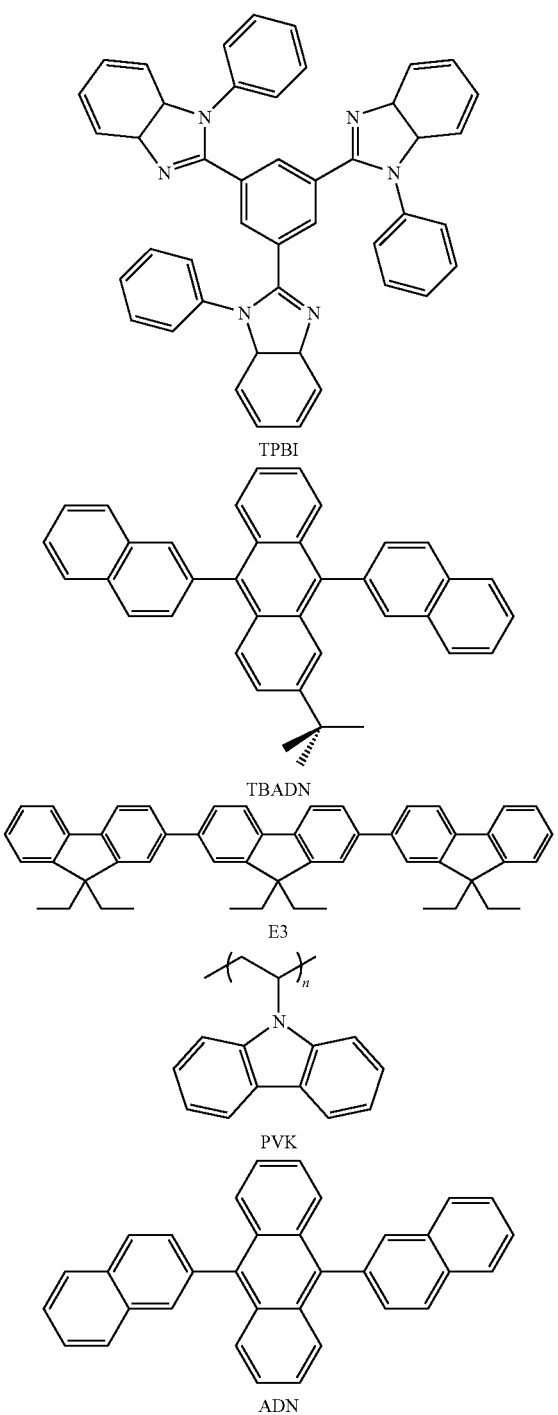

TPBI

TBADN

E3

PVK

ADN

Meanwhile, examples of a known red dopant include PtOEP, $Ir(piq)_3$, $Btp_2Ir(acac)$, which are illustrated below, and DCJTB. However, the red dopant is not limited to these materials.

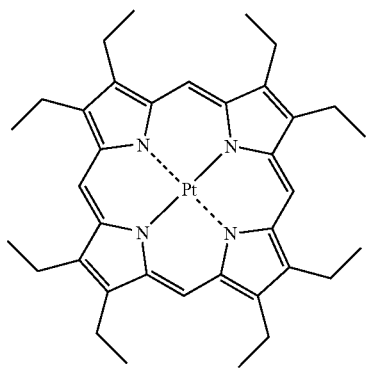

PtOEP

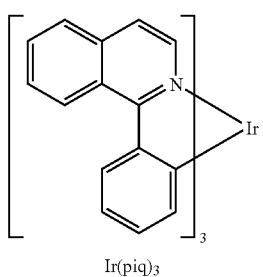

Ir(piq)₃

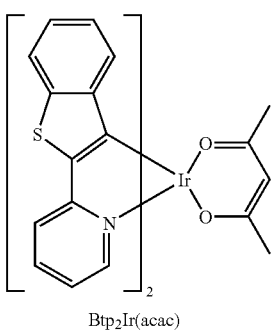

Btp₂Ir(acac)

Examples of a known green dopant include Ir(ppy)₃ where ppy=phenylpyridine, Ir(ppy)₂(acac), Ir(mpyp)₃ which are illustrated below, and C545T. However, the green dopant is not limited to these materials.

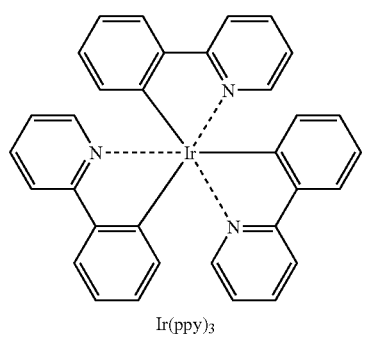

Ir(ppy)₃

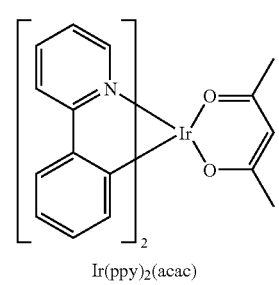

Ir(ppy)₂(acac)

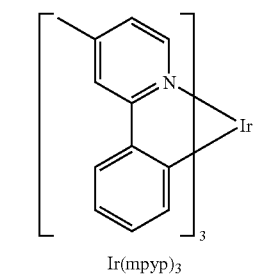

Ir(mpyp)₃

Examples of a known blue dopant include F₂Irpic illustrated below, (F₂ppy)₂Ir(tmd) illustrated below, Ir(dfppz)₃ illustrated below, ter-fluorene, 4,4'-bis[4-(di-p-tolylamino) styryl]biphenyl (DPAVBI) illustrated below, and 2,5,8,11-tetra-tert-butyl perylene (TBPe) illustrated below. However, the blue dopant is not limited to these materials.

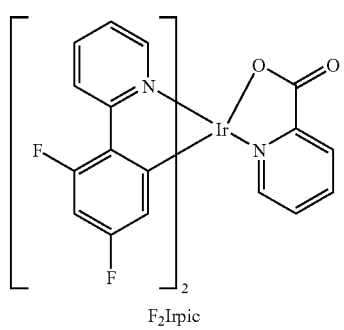

F₂Irpic

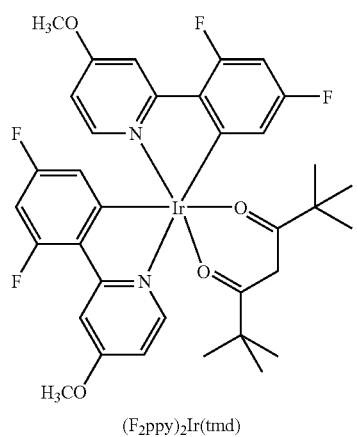

(F₂ppy)₂Ir(tmd)

-continued

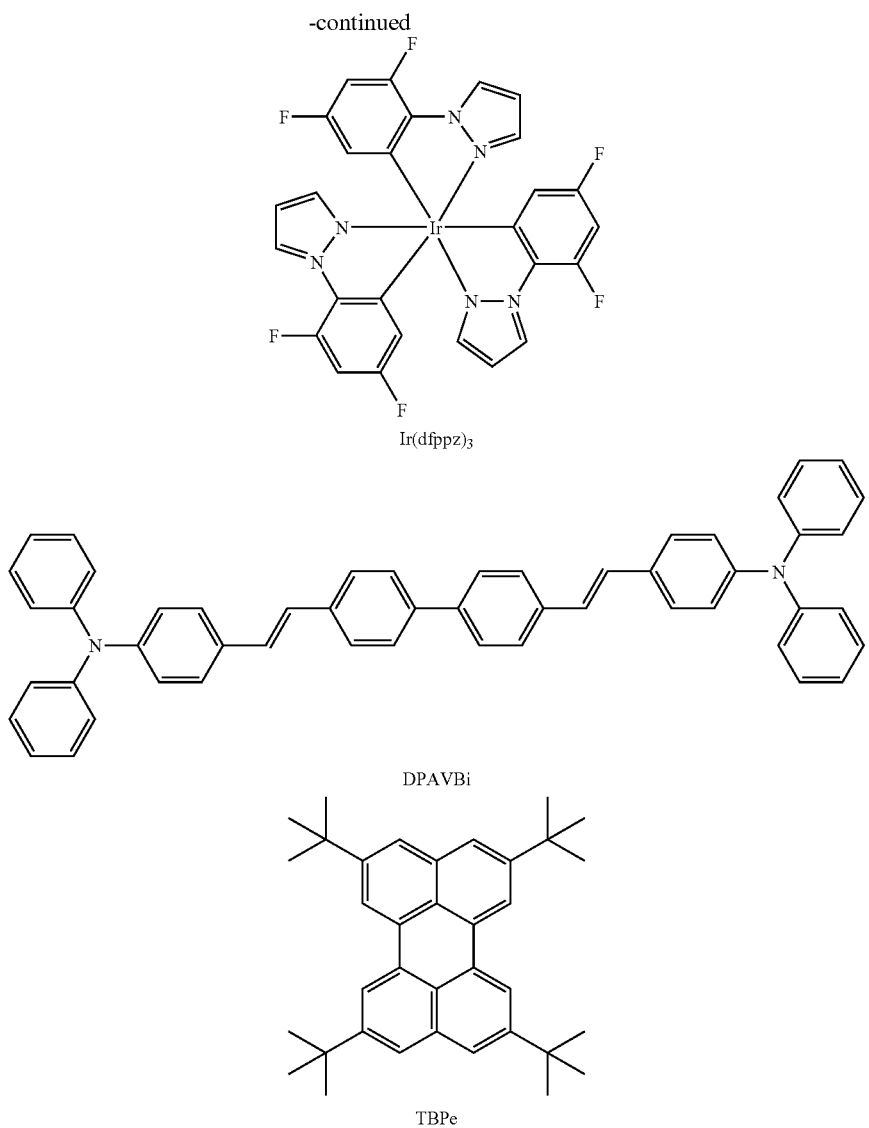

Ir(dfppz)₃

DPAVBi

TBPe

When the dopant and the host are used together, the doping concentration of the dopant is not limited. In this regard, the content of the dopant may be 0.01 to 15 parts by weight based on 100 parts by weight of the host.

In an embodiment, the thickness of the EML may be about 100 Å to 1000 Å. In another embodiment, the thickness may be 200 Å to 600 Å. If the thickness of the EML is within this range, excellent luminescent characteristics can be obtained without a substantial increase in the driving voltage.

When the EML is formed using a phosphorescent dopant, diffusion of triplet exitons or holes into the ETL can be prevented by forming an HBL between the ETL and the EML using any method selected from a vacuum-deposition method, a spin-coating method, a casting method, and an LB deposition method. When the HBL is formed using the vacuum-deposition method or the spin-coating method, deposition conditions and coating conditions may differ according to an HBL forming material. In this regard, deposition conditions and coating conditions may be the same or similar to those described with reference to the HIL. The HBL forming material may be any known hole blocking material.

In this regard, examples of the hole blocking material include an oxadiazole derivative, a triazole derivative, and a phenanthroline derivative.

In an embodiment, the thickness of the HBL may be about 50 Å to 1000 Å. In another embodiment, the thickness may be 100 Å to 300 Å. If the thickness of the HBL is within this range, excellent hole blocking characteristics can be obtained without a substantial increase in the driving voltage.

Then an ETL may be formed using any known method, such as a vacuum-deposition method, a spin-coating method, or a casting method. When the ETL is formed using the vacuum-deposition method or the spin-coating method, deposition conditions and coating conditions may differ according to an ETL forming material. In this regard, deposition conditions and coating conditions may be the same or similar to those described with reference to the HIL.

The ETL forming material may be any known electron transporting material that stably transports electrons injected from an electron injection electrode, that is, a cathode. Examples of the electron transporting material include quinoline derivatives, such as tris(8-quinolinolate)aluminum (Alq₃), TAZ illustrated below, and BAlq illustrated below. However, the ETL forming material is not limited to these materials.

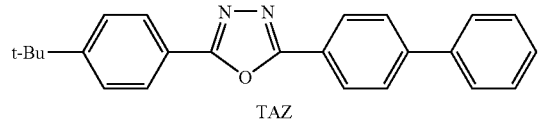

TAZ

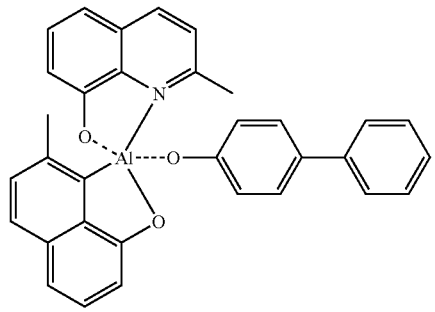

BAlq

In an embodiment, the thickness of the ETL may be about 100 Å to 1000 Å. In another embodiment, the thickness may be 150 Å to 500 Å. If the thickness of the ETL is within this range, appropriate electron transporting characteristics can be obtained without a substantial increase in the driving voltage.

Then an EIL may be formed by depositing an EIL forming material on the ETL. The EIL forming material may be a material that allows electrons to be easily injected. The EIL forming material is not limited, and may be any known EIL forming material, such as LiF, NaCl, CsF, Li₂O, or BaO. Deposition conditions of the EIL may differ according to the EIL forming material. In general, deposition conditions may be the same or similar to those described with reference to the HIL.

The thickness of the EIL may be about 1 Å to 100 Å. In another embodiment, the thickness may be 5 Å to 90 Å. If the thickness of the EIL is within this range, appropriate electron injection characteristics can be obtained without a substantial increase in the driving voltage.

The second electrode 17 that is a transmission-type electrode may be disposed on the organic layer 15. The second electrode 17 has a first surface contacting with the organic layer 15 and a second surface being opposite to the organic layer 15. The second electrode 17 may be a cathode that is an electron injection electrode. A second electrode forming metal may be a metal having a low work function, an alloy having a low work function, an electro-conductive compound, or mixtures thereof. Specifically, examples of the second electrode forming metal include lithium (Li), magnesium (Mg), aluminum (Al), aluminum-lithium (Al—Li), calcium (Ca), magnesium-indium (Mg—In), and magnesium-silver (Mg—Ag). Meanwhile, if the OLED 10 according to the current embodiment is a front emission type device, the second electrode 17 may be a transmission-type electrode formed of ITO or IZO.

The light-efficiency-improvement layer 18 is disposed on the second surface of the second electrode 17.

The light-efficiency-improvement layer 18 contains a compound represented by Formula 1:

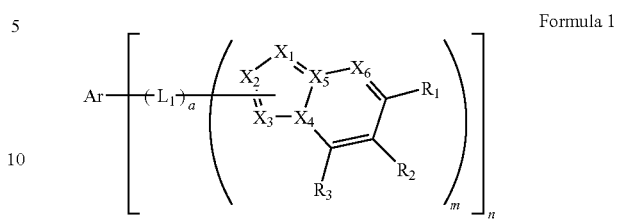

Formula 1 where Ar may be a substituted or unsubstituted $C_5$-$C_{30}$ aromatic ring system or a substituted or unsubstituted $C_2$-$C_{30}$ hetero aromatic ring system.

Examples of Ar include substituted or unsubstituted pentalenes, substituted or unsubstituted indenes, substituted or unsubstituted naphthalenes, substituted or unsubstituted azulenes, substituted or unsubstituted heptalenes, substituted or unsubstituted indacenes, substituted or unsubstituted acenaphthylenes, substituted or unsubstituted fluorenes, substituted or unsubstituted phenalenes, substituted or unsubstituted phenanthrenes, substituted or unsubstituted anthracenes, substituted or unsubstituted fluoranthenes, substituted or unsubstituted triphenylenes, substituted or unsubstituted pyrenes, substituted or unsubstituted chrysenes, substituted or unsubstituted naphthacenes, substituted or unsubstituted picenes, substituted or unsubstituted perylenes, substituted or unsubstituted pentaphenes, substituted or unsubstituted hexacenes, substituted or unsubstituted pyrroles, substituted or unsubstituted pyrazoles, substituted or unsubstituted imidazoles, substituted or unsubstituted imidazolines, substituted or unsubstituted pyridines, substituted or unsubstituted pyrazines, substituted or unsubstituted pyrimidines, substituted or unsubstituted indoles, substituted or unsubstituted purines, substituted or unsubstituted quinolines, substituted or unsubstituted phthalazines, substituted or unsubstituted indolizines, substituted or unsubstituted naphthyridines, substituted or unsubstituted quinazolines, substituted or unsubstituted cinnolines, substituted or unsubstituted indazoles, substituted or unsubstituted carbazoles, substituted or unsubstituted phenazines, substituted or unsubstituted phenanthridines, substituted or unsubstituted pyrans, substituted or unsubstituted chromenes, substituted or unsubstituted benzofurans, substituted or unsubstituted thiophenes, substituted or unsubstituted benzothiophenes, substituted or unsubstituted isothiazoles, or substituted or unsubstituted isoxazoles.

In certain embodiments, Ar may be, as described above, in addition to the unsubstituted $C_5$-$C_{30}$ aromatic ring system or the unsubstituted $C_2$-$C_{30}$ hetero aromatic ring system, the substituted $C_5$-$C_{30}$ aromatic ring system or the substituted $C_2$-$C_{30}$ hetero aromatic ring system. In the substituted $C_5$-$C_{30}$ aromatic ring system or the substituted $C_2$-$C_{30}$ hetero aromatic ring system, a substituent may be substituted or unsubstituted $C_6$-$C_{14}$ aryl groups or substituted or unsubstituted $C_2$-$C_{14}$ hetero aryl groups.

In certain embodiments, the substituent may be a phenyl group, a halophenyl group, a $C_1$-$C_{10}$ alkylphenyl group, a $C_1$-$C_{10}$ alkoxyphenyl group, a naphthyl group, a halonaphthyl group, a $C_1$-$C_{10}$ alkylnaphthyl group, a $C_1$-$C_{10}$ alkoxynaphthyl group, a pyridinyl group, a halopyridinyl group, a $C_1$-$C_{10}$ alkylpyridinyl group, a $C_1$-$C_{10}$ alkoxypyridinyl group, a quinolinyl group, a haloquinolinyl group, a $C_1$-$C_{10}$ alkylquinolinyl group, a $C_1$-$C_{10}$ alkoxyquinolinyl group, an isoquinolinyl group, a haloisoquinolinyl group, a $C_1$-$C_{10}$ alkylisoquinolinyl group, or a $C_1$-$C_{10}$ alkoxyisoquinolinyl group, but is not limited thereto.

In Formula 1, $L_1$ may be a substituted or unsubstituted $C_1$-$C_{30}$ alkylene group, a substituted or unsubstituted $C_5$-$C_{30}$ arylene group, or a substituted or unsubstituted $C_2$-$C_{30}$ hetero arylene group.

In certain embodiments, $L_1$ may be a substituted or unsubstituted $C_6$-$C_{14}$ arylene group or a substituted or unsubstituted $C_2$-$C_{14}$ hetero arylene group. In certain embodiments, $L_1$ may be a phenylene group, a halophenylene group, a $C_1$-$C_{10}$ alkylphenylene group, a $C_1$-$C_{10}$ alkoxyphenylene group, a naphthylene group, a halonaphthylene group, a $C_1$-$C_{10}$ alkylnaphthylene group, or a $C_1$-$C_{10}$ alkoxynaphthylene group, but is not limited thereto.

In Formula 1, a denotes a repeat number of $L_1$, and may be an integer of 0 to 10. In some embodiments, a may be an integer from 0 to 3. If a is 0, in Formula 1, a heterocyclic ring situated at the right side of $L_1$ may be directly connected to Ar. If a is 2 or greater, a plurality of $L_1$ may be identical to or different from each other.

In Formula 1, -$(L_1)_a$- may be represented by any one of Formulae 2a through 2g, but is not limited thereto.

Formula 2a

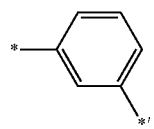

Formula 2b

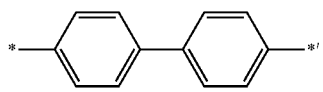

Formula 2c

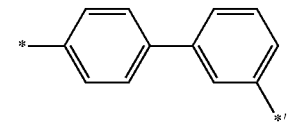

Formula 2d

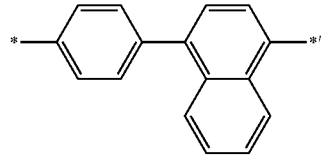

Formula 2e

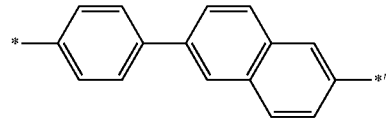

Formula 2f

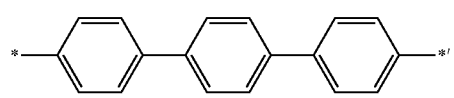

Formula 2g

In Formulae 2a-2g, * represents a binding site with Ar and *' represents a binding site with a heterocyclic ring at the right side of $L_1$ in Formula 1. For example, -$(L_1)_a$- may be represented by Formula 2a.

For example, in Formula 1, $X_1$ is N, $CY_1$, or a carbon atom bonded to $L_1$ or Ar; $X_2$ is N, $CY_2$, or a carbon atom bonded to $L_1$ or Ar; $X_3$ is N, $CY_3$, or a carbon atom bonded to $L_1$ or Ar; $X_4$ is N; $X_5$ is a carbon atom; $X_6$ is N or $CY_6$; wherein one of $X_1$, $X_2$ and $X_3$ is a carbon atom bonded to $L_1$ or Ar. Particularly, $X_1$ may be $CY_1$ or N; $X_2$ may be a carbon atom bonded to $L_1$ or Ar; $X_3$ may be $CY_3$ or N; $X_4$ may be N; $X_5$ may be a carbon atom; $X_6$ may be N or $CY_6$.

In certain embodiments, at least one of $X_1$, $X_4$ and $X_6$ may be N. In certain embodiments, each of $X_1$ and $X_4$ may be N. In certain other embodiments, each of $X_1$, $X_4$ and $X_6$ may be N.

In Formula 1, each of $R_1$ through $R_3$, and $Y_1$ through $Y_6$ in $X_1$ through $X_6$ is independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_5$-$C_{30}$ aryl group, or a substituted or unsubstituted $C_2$-$C_{30}$ hetero aryl group. In this regard, two or more neighboring elements selected from $R_1$ through $R_3$ and $Y_1$ through $Y_6$ may be selectively bonded to each other to form a saturated or an unsaturated ring.

In certain embodiments, each of $R_1$ through $R_3$ and $Y_1$ through $Y_6$ is independently a hydrogen atom, a substituted or unsubstituted $C_1$-$C_{10}$ alkyl group, a substituted or unsubstituted $C_2$-$C_{10}$ alkenyl group, a substituted or unsubstituted $C_6$-$C_{14}$ aryl group, or a $C_2$-$C_{14}$ hetero aryl group.

In certain embodiments, each of $R_1$ through $R_3$ and $Y_1$ through $Y_6$ is independently selected from a hydrogen atom, $C_1$-$C_{10}$ alkyl groups, $C_1$-$C_{10}$ halo alkyl groups, $C_2$-$C_{10}$ alkenyl groups, $C_2$-$C_{10}$ halo alkenyl groups, phenyl groups, halophenyl groups, $C_1$-$C_{10}$ alkylphenyl groups, $C_1$-$C_{10}$ alkoxyphenyl groups, naphthyl groups, halonaphthyl groups, $C_1$-$C_{10}$ alkylnaphthyl groups, or $C_1$-$C_{10}$ alkoxynaphthyl groups, but is not limited thereto. For example, each of $R_1$ through $R_3$ and $Y_1$ through $Y_6$ may be independently selected from a hydrogen atom, a methyl group, and a phenyl group. For example, $Y_3$, $Y_6$, $R_1$, $R_2$, and $R_3$ may be a hydrogen atom. For example, $R_3$ may be selected from a hydrogen atom, a methyl group and a phenyl group. For example, $Y_6$ and $R_1$ may be bonded to each other to form a saturated or unsaturated ring, such as a phenyl ring.

In Formula 1, m denotes the number of the heterocyclic ring situated at the right side of $L_1$, wherein the heterocyclic ring can be bonded to $L_1$ or Ar and m is dependent upon the structure of Ar or $L_1$. For example, m may be an integer from 1 to 5. For example, m could be 1.

In Formula 1, n is an integer from 1 to 10, and is dependent upon the structure of Ar. For example, n could be 1 or 2.

According to an embodiment of the present invention, the compound represented by Formula 1 may be any one compound selected from compounds represented by Formulae 1A through 1X, but is not limited thereto:

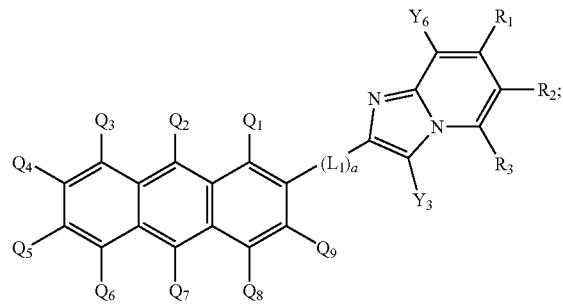
Formula 1A
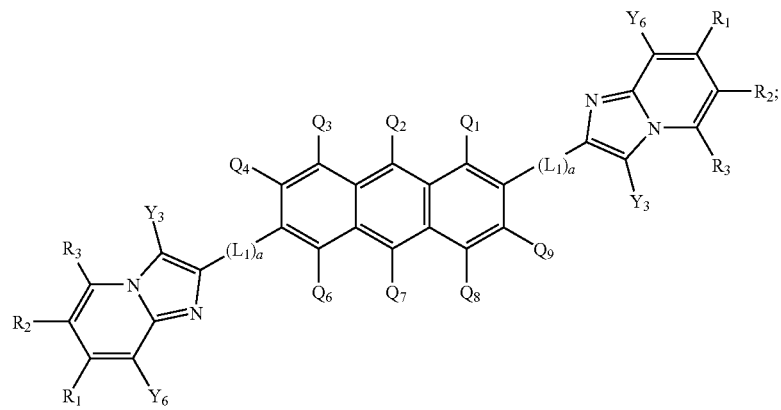
Formula 1B
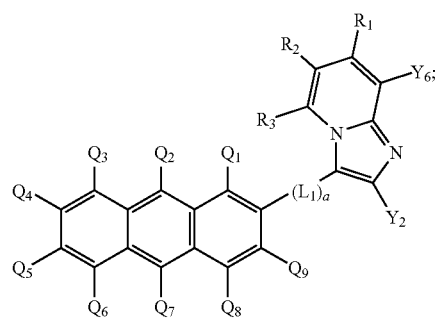
Formula 1C
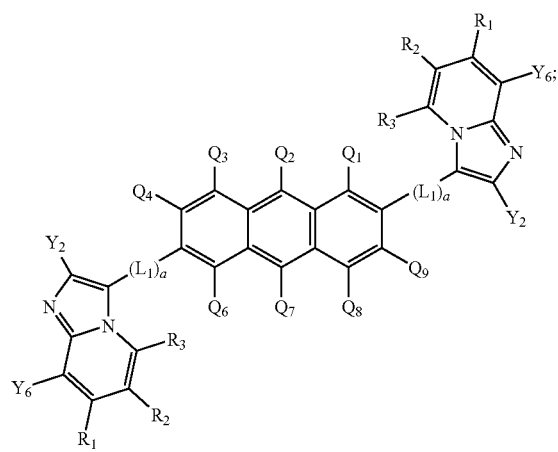
Formula 1D
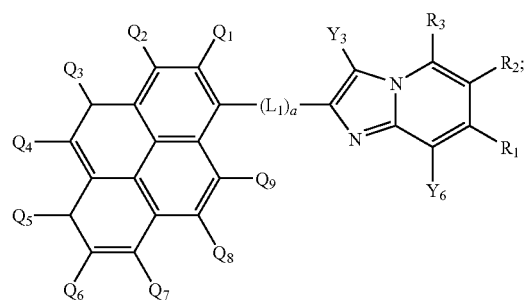
Formula 1E Formula 1F
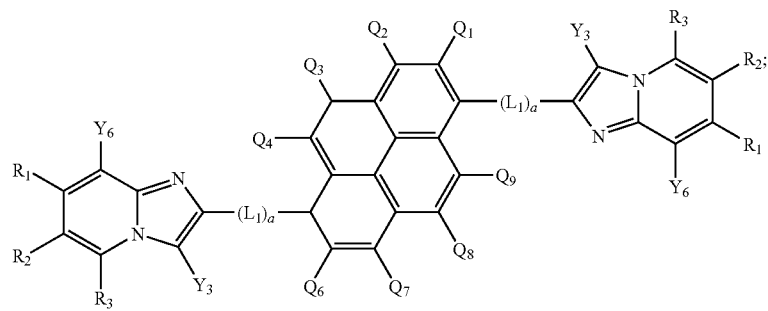
Formula 1G
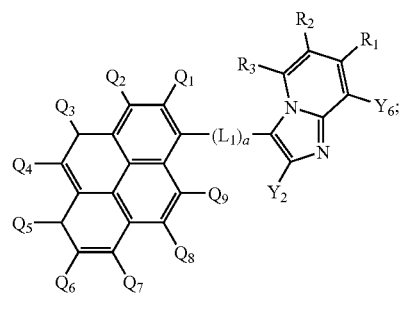
Formula 1H
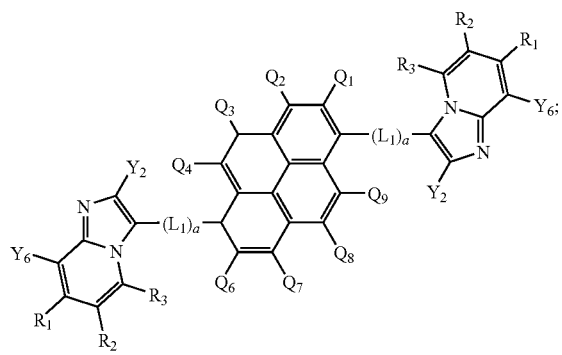
Formula 1I
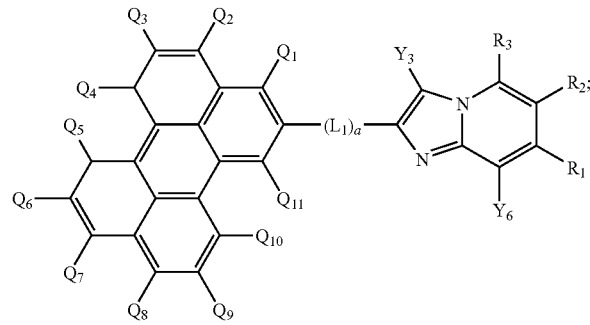
Formula 1J
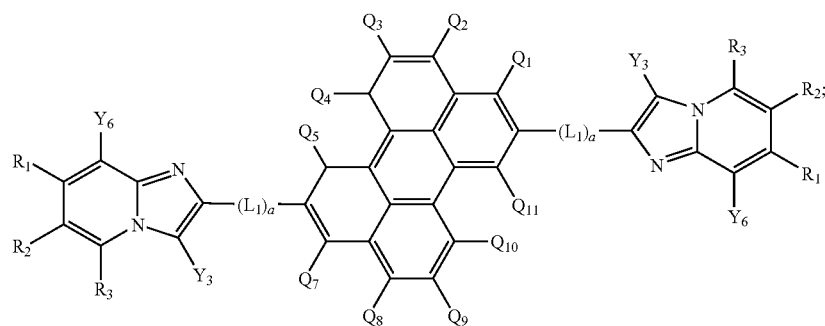

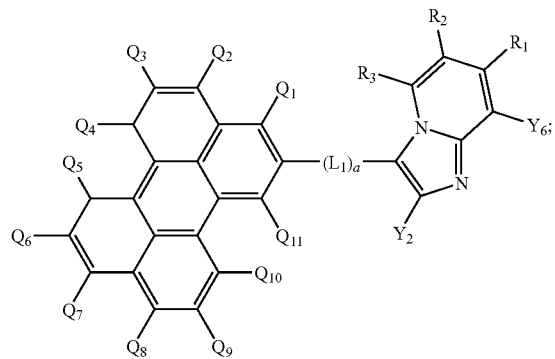
Formula 1K
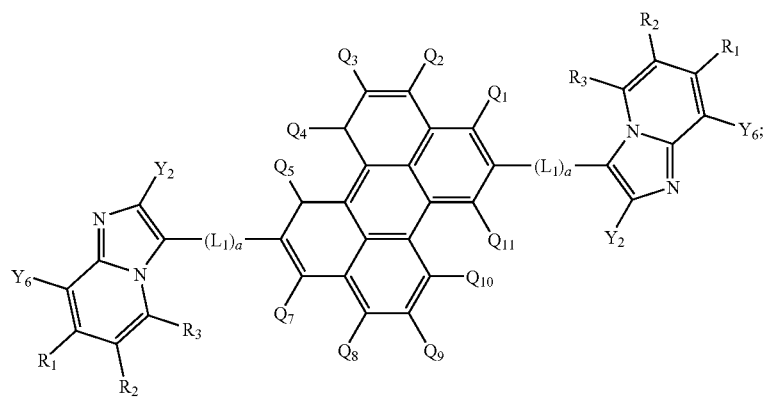
Formula 1L
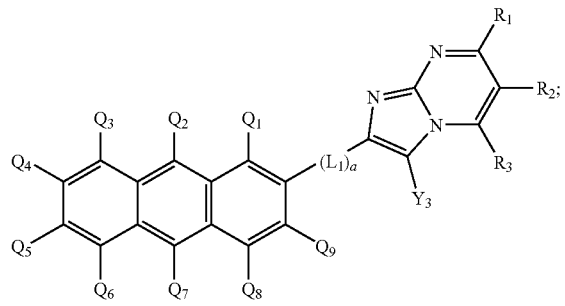
Formula 1M
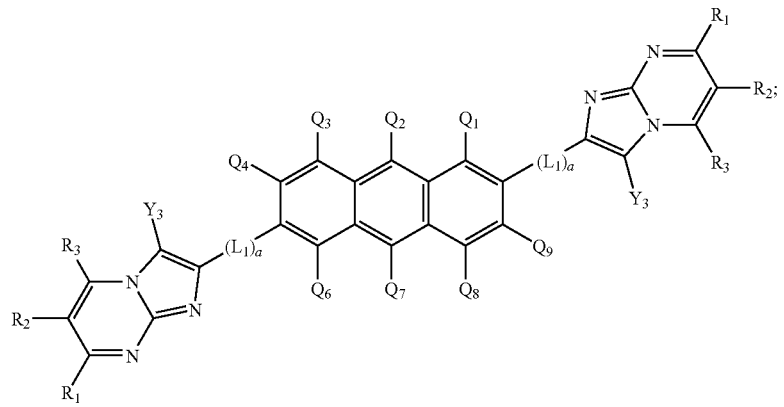
Formula 1N -continued
Formula 1O
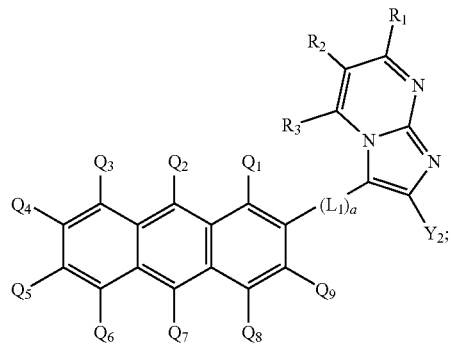
Formula 1P
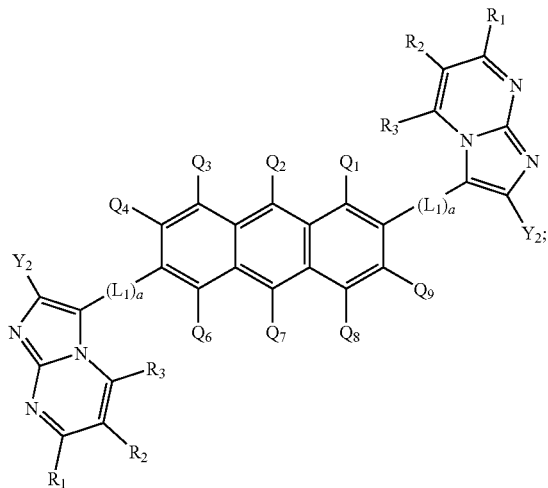
Formula 1Q
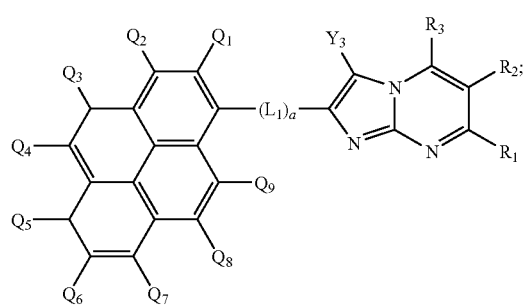
Formula 1R
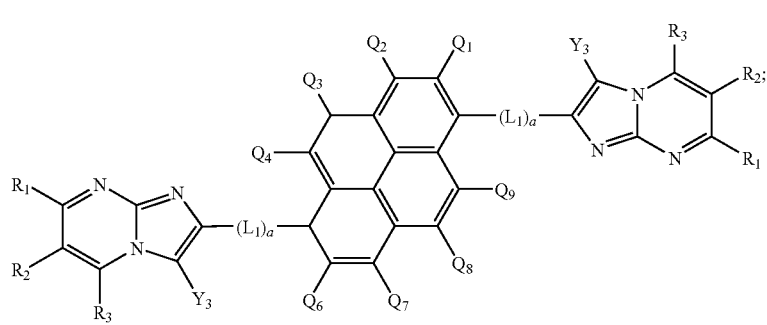
Formula 1S
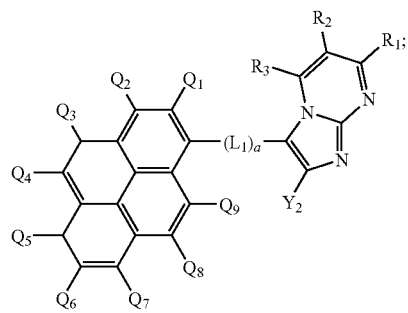
Formula 1T
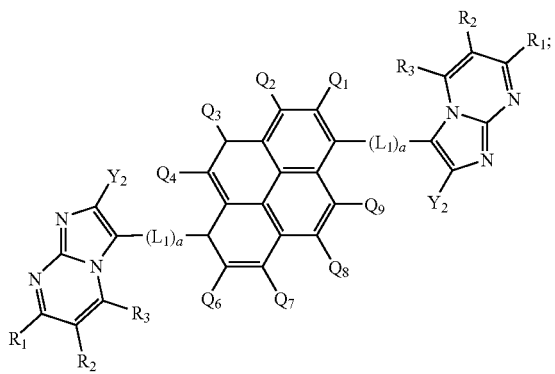

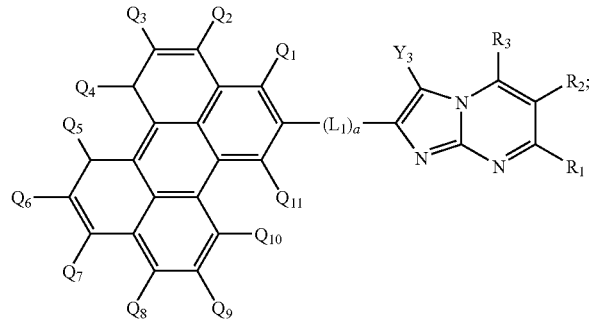

Formula 1U

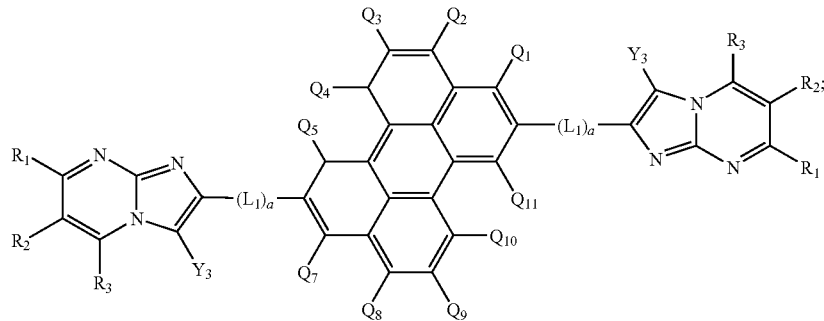

Formula 1V

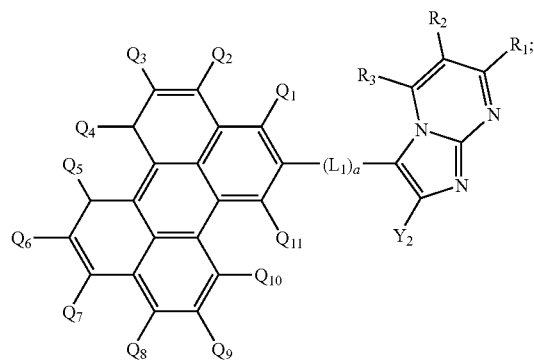

Formula 1W

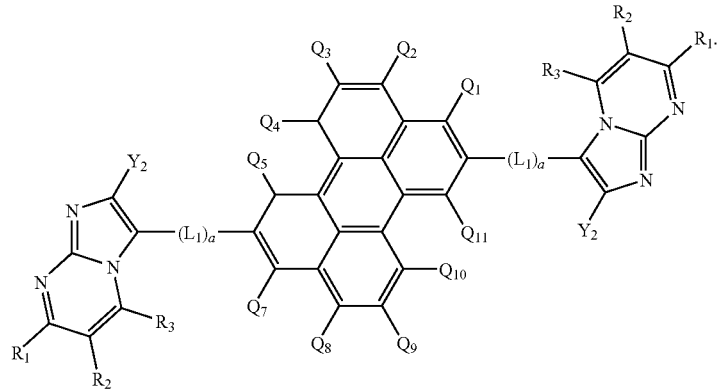

Formula 1X

In Formulae 1A through 1X, each of $Q_1$ through $Q_{11}$ may be independently a hydrogen atom, a substituted or unsubstituted $C_6$-$C_{14}$ aryl group, or a substituted or unsubstituted $C_2$-$C_{14}$ hetero aryl group.

In certain embodiments, each of $Q_1$ through $Q_{11}$ is independently selected from a hydrogen atom, phenyl group, a halophenyl group, a $C_1$-$C_{10}$ alkylphenyl group, a $C_1$-$C_{10}$ alkoxyphenyl group, a naphthyl group, a halonaphthyl group, a $C_1$-$C_{10}$ alkylnaphthyl group, a $C_1$-$C_{10}$ alkoxynaphthyl group, a pyridinyl group, a halopyridinyl group, a $C_1$-$C_{10}$ alkylpyridinyl group, a $C_1$-$C_{10}$ alkoxypyridinyl group, a quinolinyl group, a haloquinolinyl group, a $C_1$-$C_{10}$ alkylquinolinyl group, a $C_1$-$C_{10}$ alkoxyquinolinyl group, an isoquinolinyl group, a haloisoquinolinyl group, a $C_1$-$C_{10}$ alkylisoquinolinyl group, or a $C_1$-$C_{10}$ alkoxyisoquinolinyl group, but is not limited thereto.

In certain embodiments, in Formulae 1A-1D, and 1M-1P, each of $Q_2$ and $Q_7$ is a substituted or unsubstituted $C_6$-$C_{14}$ aryl group or a substituted or unsubstituted $C_2$-$C_{14}$ hetero aryl group. That is, in Formulae 1A-1D and 1M-1P, the 9 and 10 positions of an anthracene ring that correspond to $Q_2$ and $Q_7$ positions may not be bonded to the heterocyclic ring situated at the right side of $L_1$. For example, in Formulae 1A-1D and 1M-1P, each of $Q_2$ and $Q_7$ is independently selected from a phenyl group and a naphthyl group and each of $Q_1$, $Q_3$-$Q_6$ and $Q_8$-$Q_9$ is a hydrogen atom. This is because the 9 and 10 positions of the anthracene ring are structurally weak points. When the 9 and 10 positions of the anthracene ring are substituted with specific functional groups, the specific functional groups may be easily separated from the anthracene ring due to heat, oxygen, and humidity. For example, when the heterocyclic ring situated at the right side of $L_1$ is connected to the 9 and 10 positions of the anthracene ring, the heterocyclic ring situated at the right side of $L_1$ may be easily separated from the anthracene ring due to heat generated in a process for forming an organic layer of an organic light emitting diode, for example, a deposition process, or heat generated when the organic light emitting diode is driven, and thus, characteristics of the organic light emitting diode may be degraded.

In Formula 1A through 1X, $L_1$ may be a substituted or unsubstituted $C_6$-$C_{14}$ arylene group, or a substituted or unsubstituted $C_2$-$C_{14}$ hetero arylene group.

In certain embodiments, $L_1$ may be a phenylene group, a halophenylene group, a $C_1$-$C_{10}$ alkylphenylene group, a $C_1$-$C_{10}$ alkoxyphenylene group, a naphthylene group, a halonaphthylene group, a $C_1$-$C_{10}$ alkylnaphthylene group, or a $C_1$-$C_{10}$ alkoxynaphthylene group, but is not limited thereto.

In Formulae 1A through 1X, each of $R_1$, $R_2$, $R_3$, $Y_2$, $Y_3$, and $Y_6$ may be independently a hydrogen atom, a substituted or unsubstituted $C_1$-$C_{10}$ alkyl group, a substituted or unsubstituted $C_2$-$C_{10}$ alkenyl group, a substituted or unsubstituted $C_6$-$C_{14}$ aryl group, or a $C_2$-$C_{14}$ hetero aryl group. In this regard, two or more neighboring elements selected from $R_1$, $R_2$, $R_3$, $Y_2$ and $Y_3$ may be selectively bonded to each other to form a $C_6$-$C_{12}$ aromatic ring.

In Formula 1A through 1X, a is 1 or 2.

The compound represented by Formula 1 may be any compound selected from Compounds 1 through 64, but is not limited thereto:

Compound 1

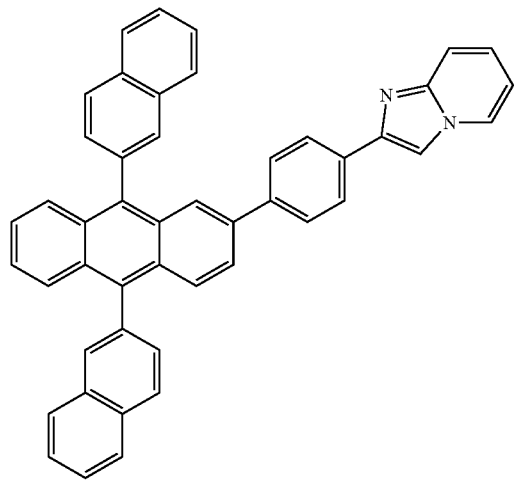

Compound 2

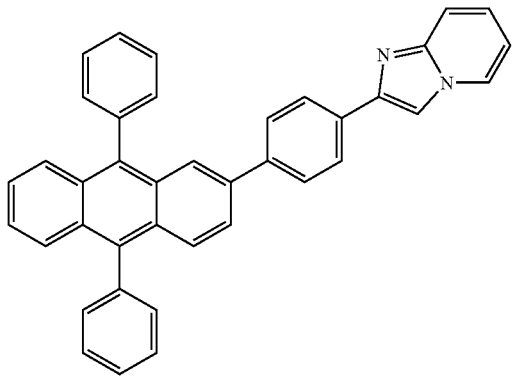

Compound 3

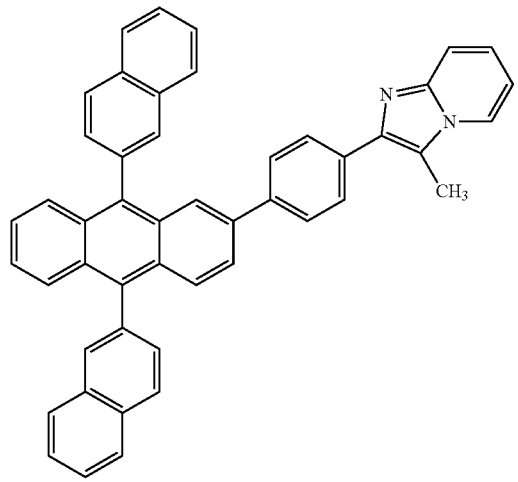

Compound 4

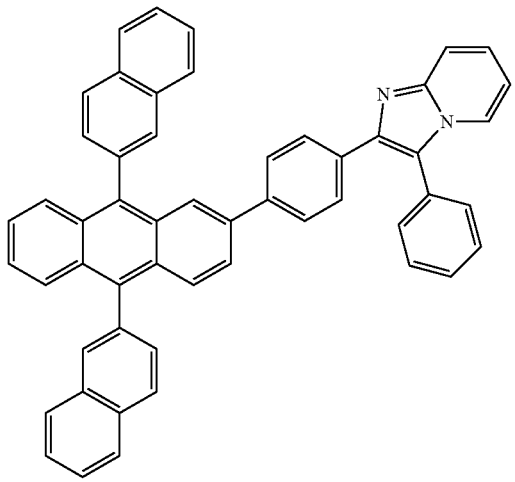

Compound 5
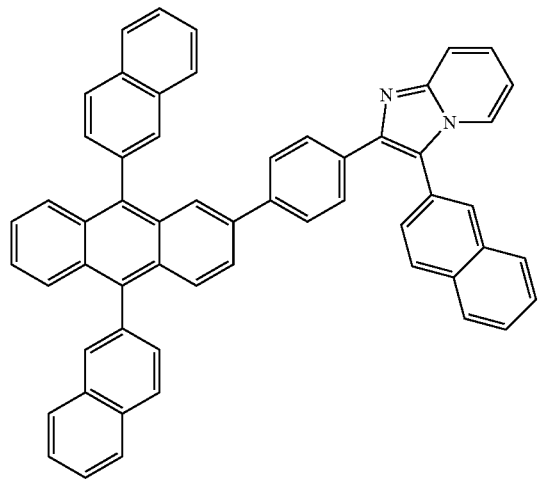
Compound 6
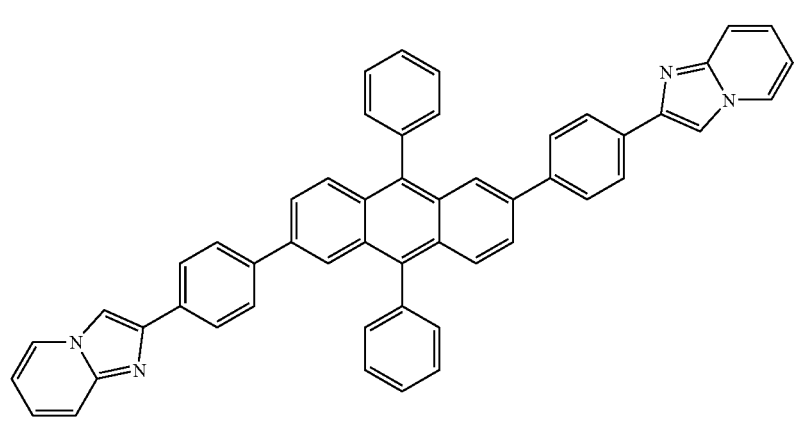
Compound 7
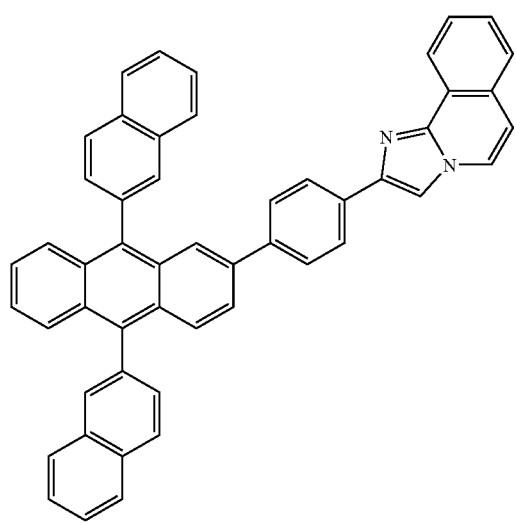
Compound 8
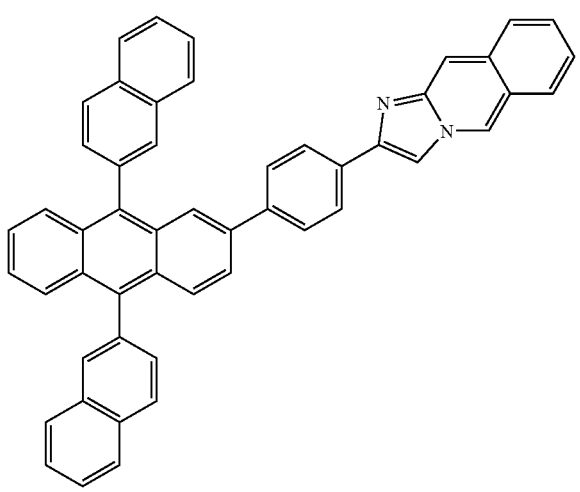

-continued
Compound 9
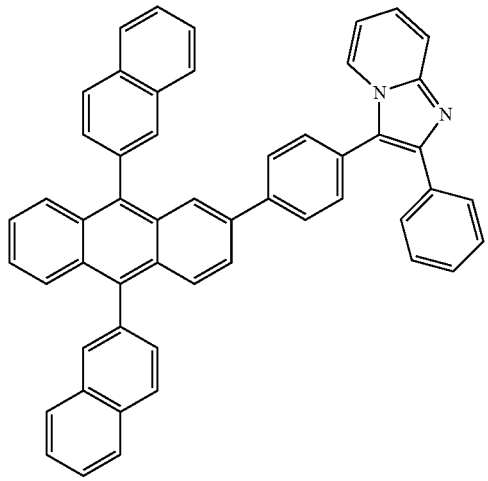
Compound 10
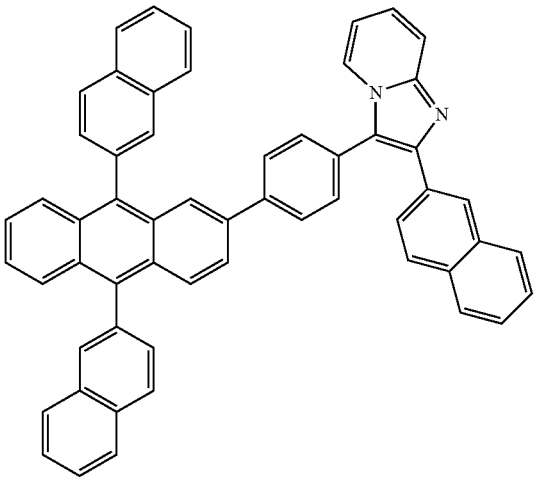
Compound 11
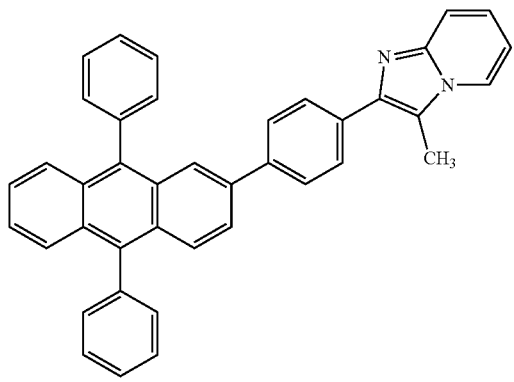
Compound 12
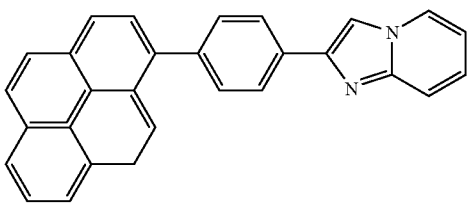
Compound 13
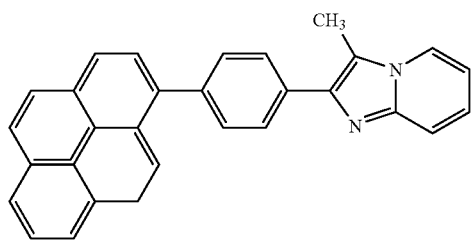
Compound 14
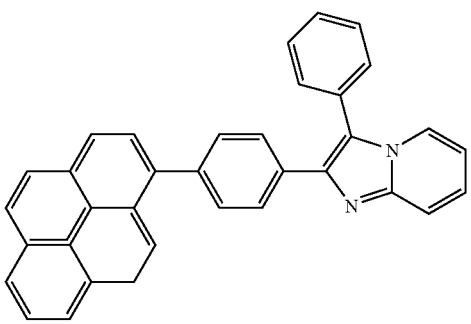
Compound 15
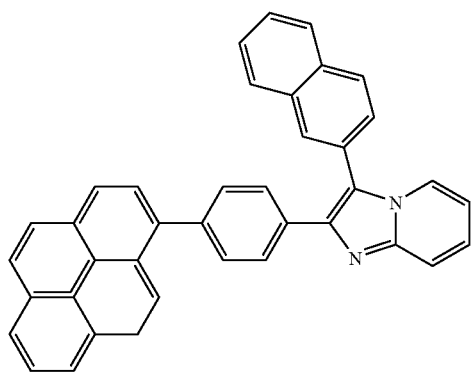

-continued
Compound 16
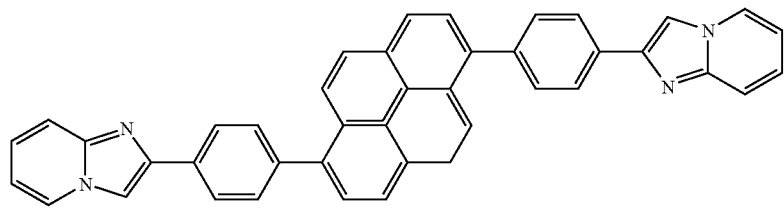
Compound 17
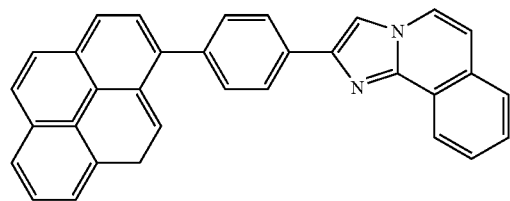
Compound 18
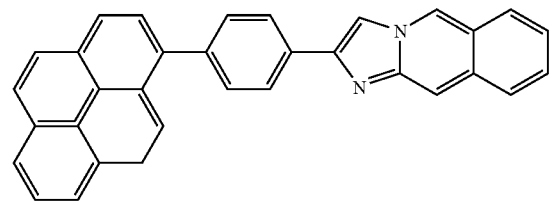
Compound 19
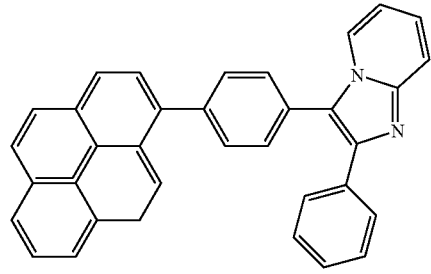
Compound 20
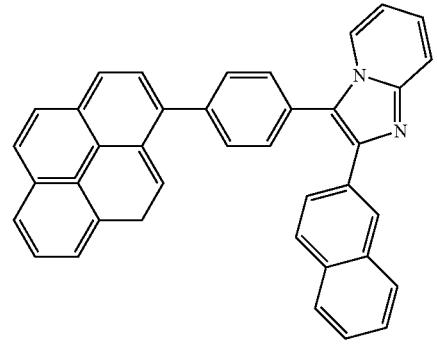
Compound 21
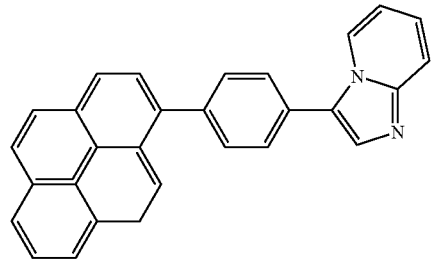
Compound 22
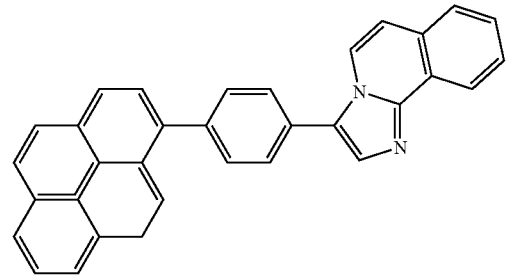
Compound 23
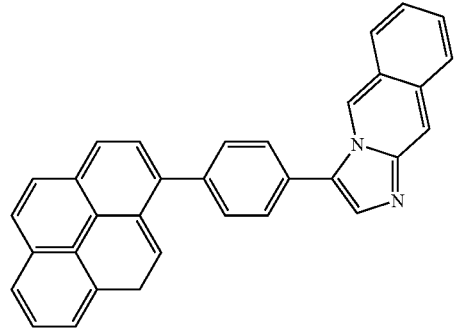
Compound 24
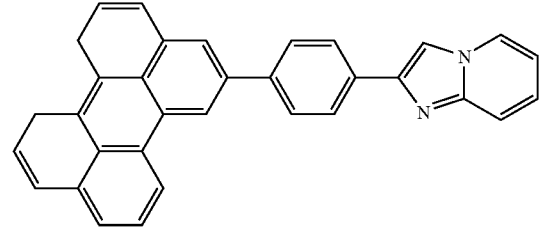

-continued
Compound 25
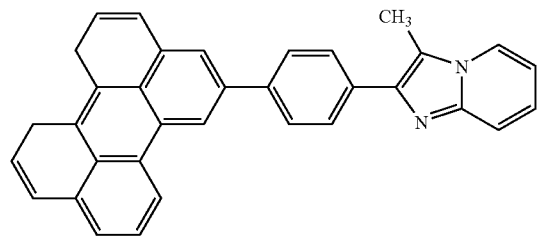
Compound 26
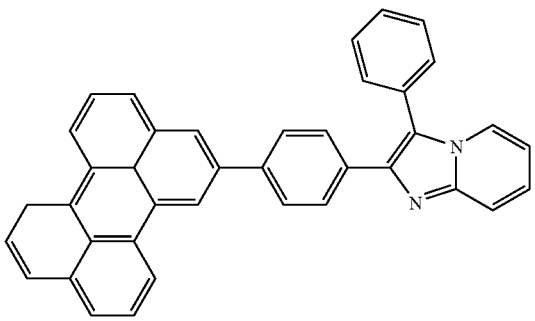
Compound 27
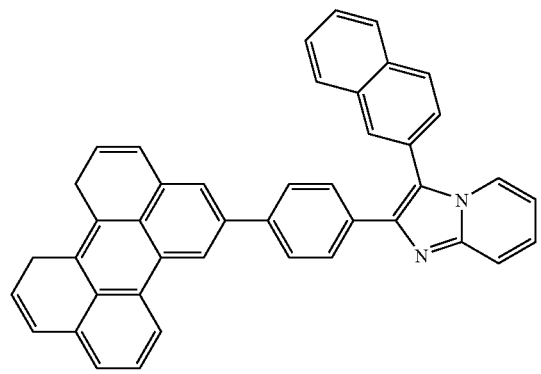
Compound 28
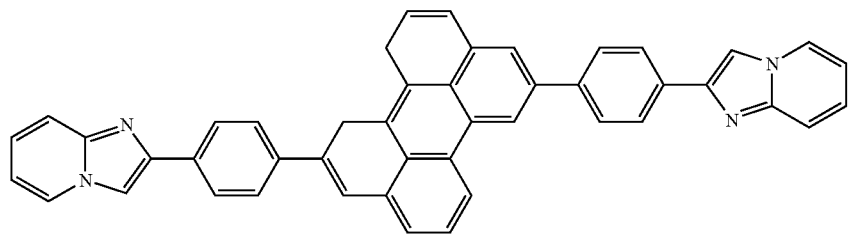
Compound 29
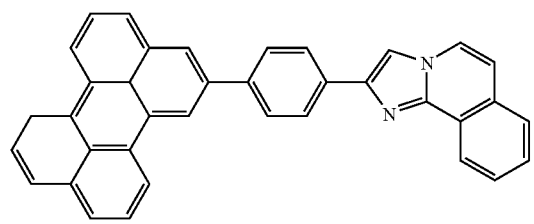
Compound 30
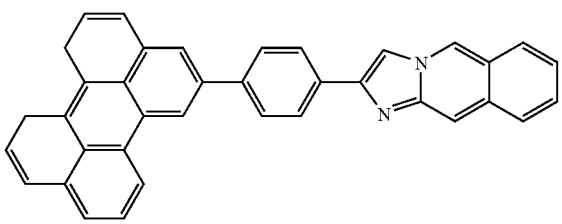
Compound 31
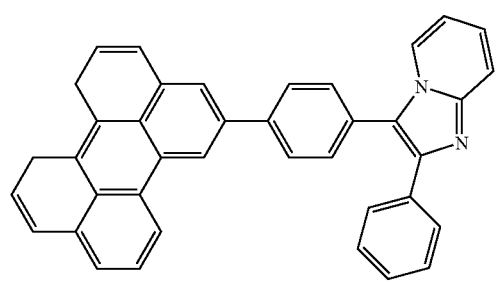
Compound 32
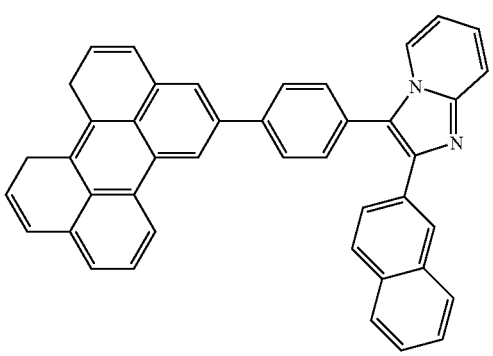

-continued
Compound 33
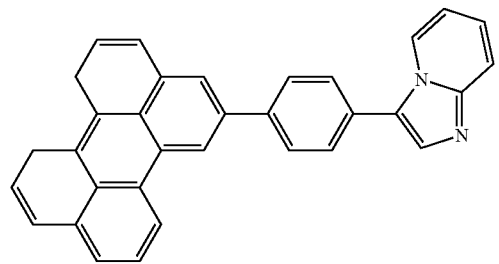
Compound 34
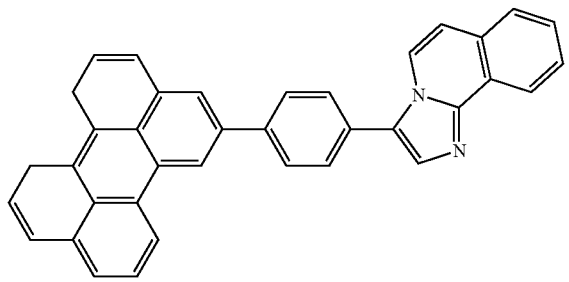
Compound 35
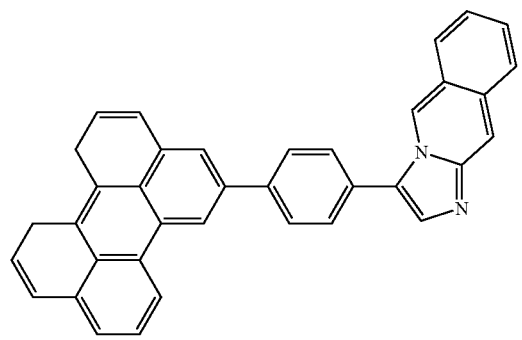
Compound 36
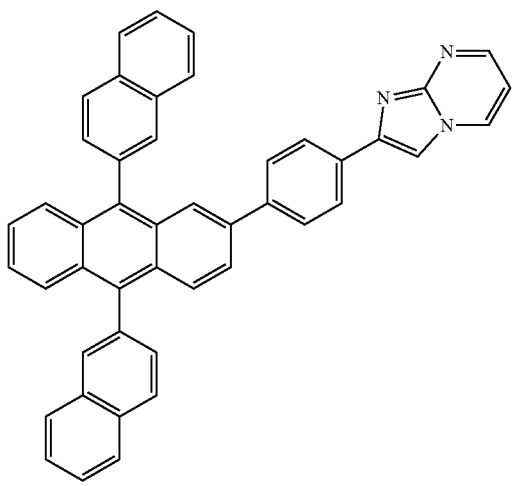
Compound 37
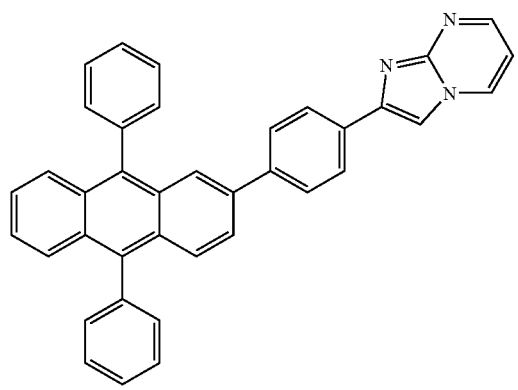
Compound 38
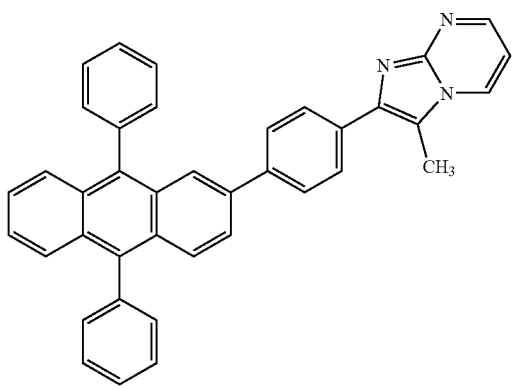

-continued
Compound 39
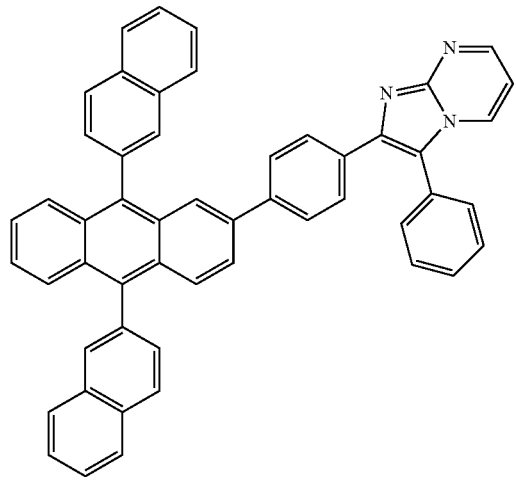
Compound 40
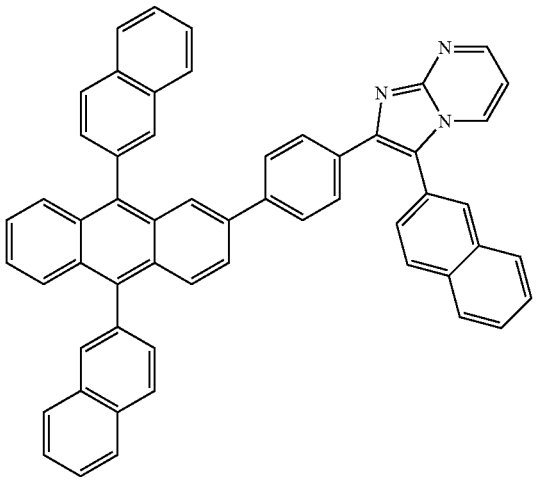
Compound 41
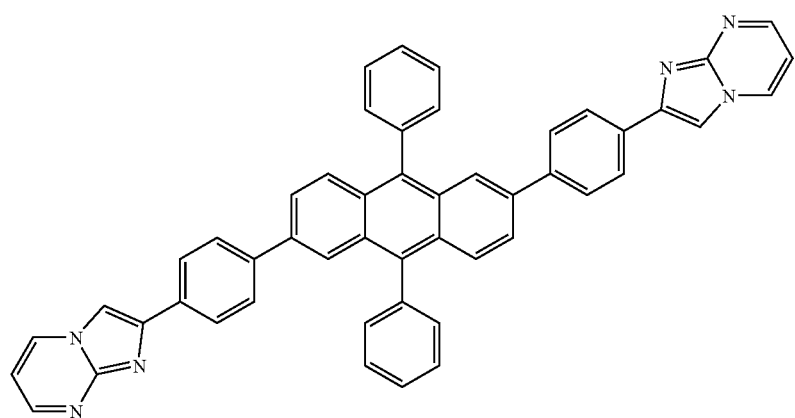
Compound 42
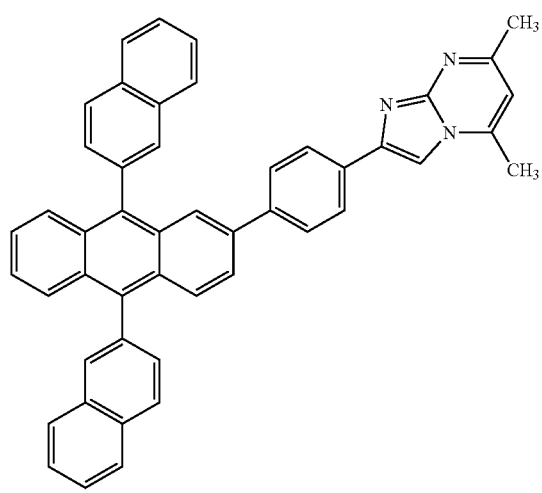
Compound 43
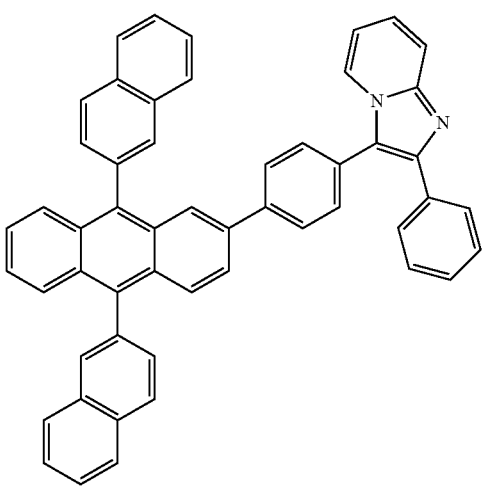

-continued
Compound 44
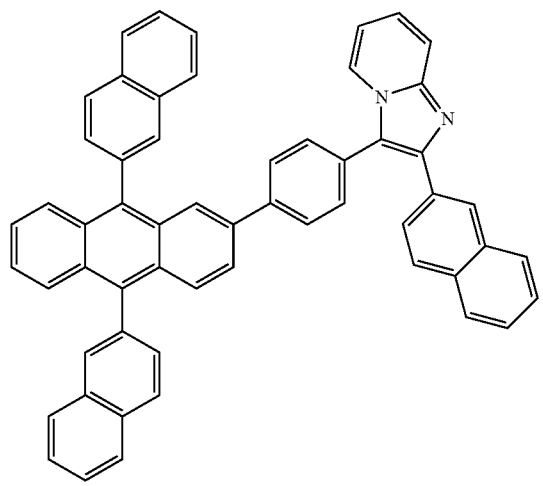
Compound 45
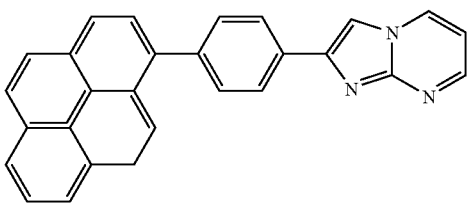
Compound 46
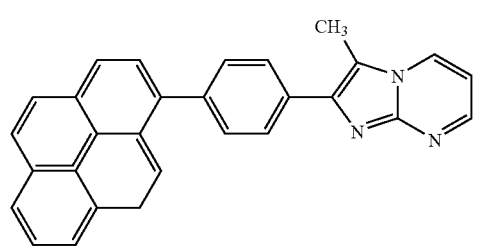
Compound 47
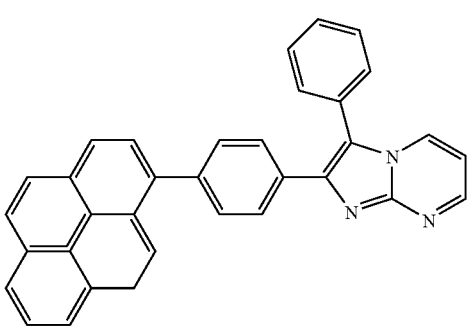
Compound 48
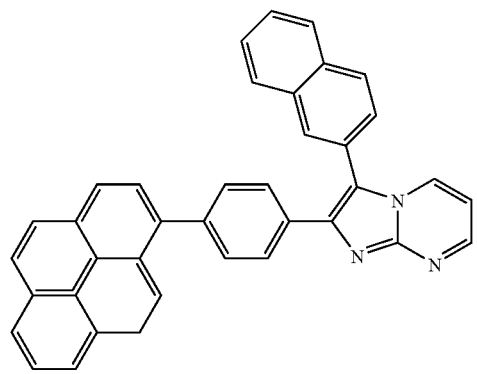
Compound 49
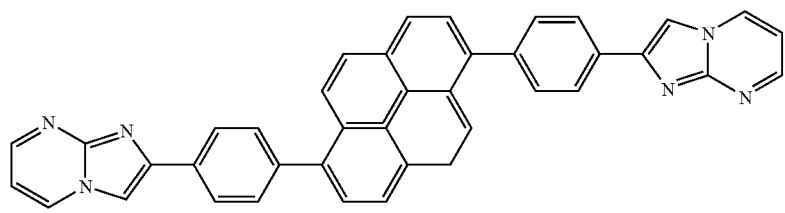

-continued
Compound 50
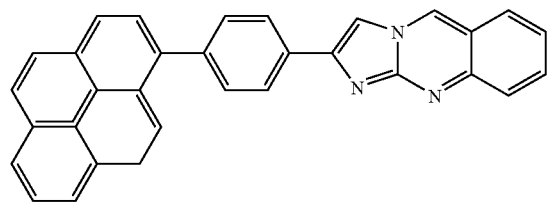
Compound 51
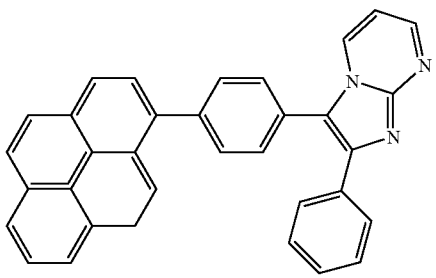
Compound 52
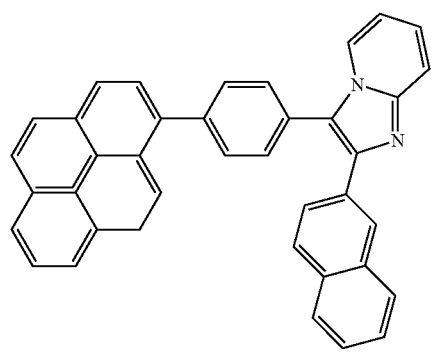
Compound 53
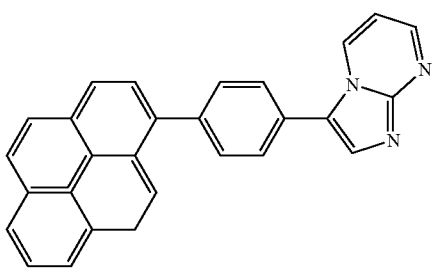
Compound 54
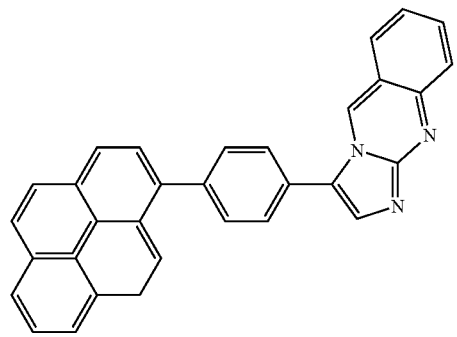
Compound 55
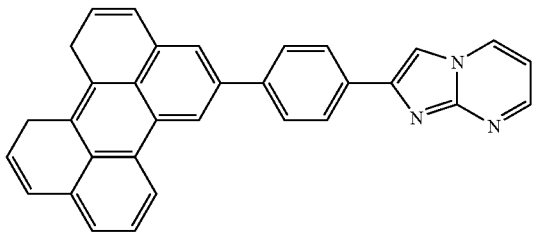
Compound 56
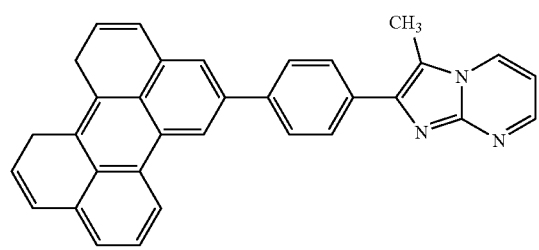
Compound 57
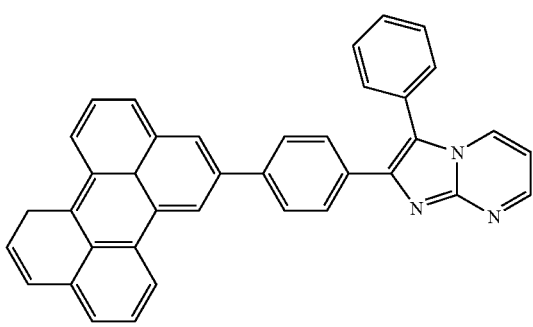

-continued
Compound 58
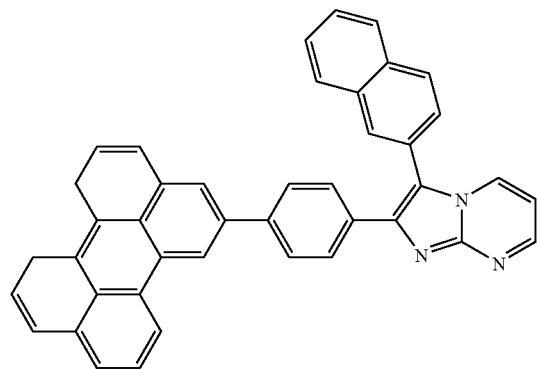
Compound 59
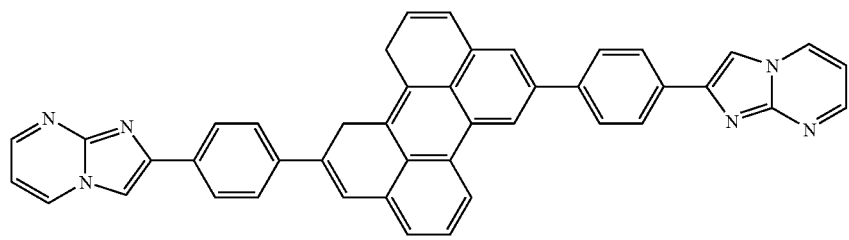
Compound 60
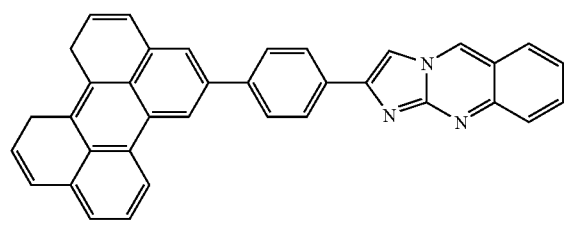
Compound 61
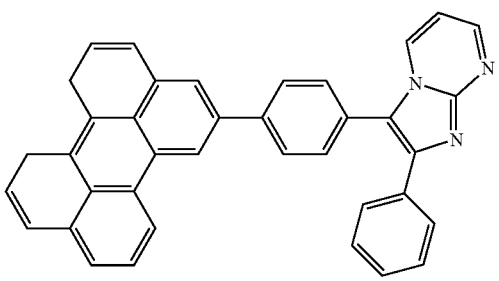
Compound 62
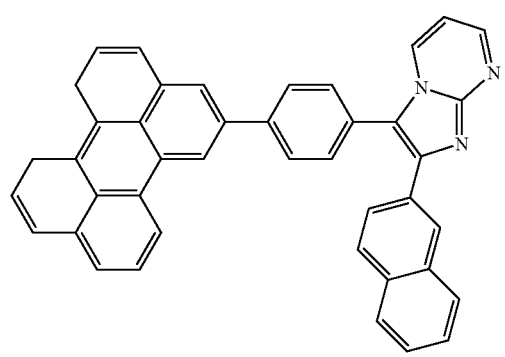
Compound 63
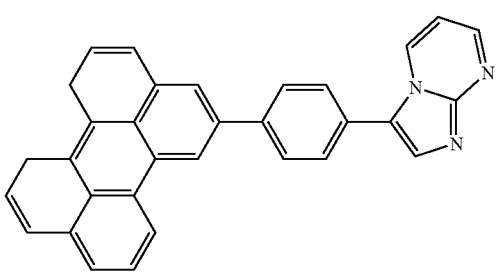
Compound 64
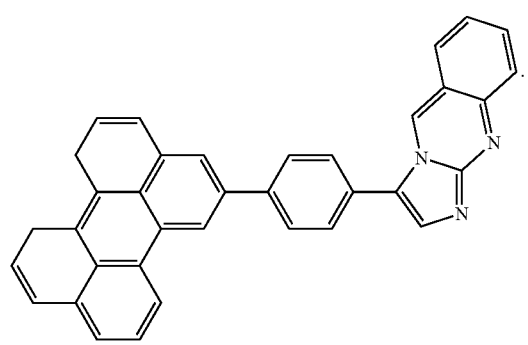

In certain embodiments, the unsubstituted $C_1$-$C_{30}$ alkyl group may be methyl, ethyl, propyl, isobutyl, sec-butyl, pentyl, iso-amyl, or hexyl. In the unsubstituted $C_1$-$C_{30}$ alkyl group, one or more hydrogen atoms may be substituted with a halogen atom, a hydroxyl group, a nitro group, a cyano group, an amino group, an amidino group, a hydrazine, a hydrazone, a carboxylic group or salt thereof, a sulfonic acid group or salt thereof, a phosphoric acid or salt thereof, a $C_1$-$C_{30}$ alkyl group, a $C_1$-$C_{30}$ alkenyl group, a $C_1$-$C_{30}$ alkynyl group, a $C_6$-$C_{30}$ aryl group, a $C_7$-$C_{20}$ aryl alkyl group, a $C_2$-$C_{20}$ hetero aryl group, or a $C_3$-$C_{30}$ hetero aryl alkyl group.

In certain embodiments, the unsubstituted $C_1$-$C_{30}$ alkylene group refers to a divalent group having the same structure as the unsubstituted $C_1$-$C_{30}$ alkyl group described above.

In certain embodiments, the unsubstituted $C_1$-$C_{30}$ alkoxy group may be represented by —OA where A is an unsubstituted $C_1$-$C_{30}$ alkyl group described above. Examples of suitable unsubstituted $C_1$-$C_{30}$ alkoxy groups include methoxys, ethoxys, and isopropyloxys. In the unsubstituted $C_1$-$C_{30}$ alkoxy group, one or more hydrogen atoms may be substituted with the substituents which have been described with the unsubstituted $C_1$-$C_{30}$ alkyl group.

In certain embodiments, examples of unsubstituted $C_1$-$C_{30}$ acyl groups include acetyls, ethylcarbonyls, isopropylcarbonyls, phenylcarbonyls, naphthylenecarbonyls, diphenylcarbonyls, and cyclohexylcarbonyls. In the unsubstituted $C_1$-$C_{30}$ acyl group, one or more hydrogen atoms may be substituted with the substituents which have been described with the unsubstituted $C_1$-$C_{30}$ alkyl group.

In certain embodiments, the unsubstituted $C_2$-$C_{30}$ alkenyl group refers to unsubstituted $C_1$-$C_{30}$ alkyl groups which have a C—C double bond in the center or end thereof. Examples of suitable unsubstituted $C_2$-$C_{30}$ alkenyl group include ethenyls, propenyls, and butenyls. In the unsubstituted $C_2$-$C_{30}$ alkenyl group, one or more hydrogen atoms may be substituted with the substituents which have been described with the unsubstituted $C_1$-$C_{30}$ alkyl group.

In certain embodiments, the unsubstituted $C_2$-$C_{30}$ alkynyl group refers to unsubstituted $C_1$-$C_{30}$ alkyl groups that have a C—C triple bond in the center or end thereof. Examples of suitable unsubstituted $C_2$-$C_{30}$ alkynyl groups include acetylenes, propylenes, phenylacetylenes, naphthylacetylenes, isopropylacetylenes, t-butylacetylenes, and diphenylacetylenes. In the unsubstituted $C_2$-$C_{30}$ alkynyl group, one or more hydrogen atoms may be substituted with the substituents which have been described with the unsubstituted $C_1$-$C_{30}$ alkyl group.

In certain embodiments, the unsubstituted $C_5$-$C_{30}$ aromatic ring system refers to a carbocyclic aromatic system having one or more aromatic rings and 5-30 carbon atoms. When the aromatic ring system includes 2 or more rings, the 2 or more rings may be fused together or connected to each other through a single bond. In the unsubstituted $C_5$-$C_{30}$ aromatic ring system, one or more hydrogen atoms may be substituted with the substituents which have been described with the unsubstituted $C_1$-$C_{30}$ alkyl group. Specifically, non-limiting examples of the substituted or unsubstituted $C_5$-$C_{30}$ aromatic ring system and non-limiting examples of the substituent of the substituted or unsubstituted $C_5$-$C_{30}$ aromatic ring system have already been described above.

In certain embodiments, the unsubstituted $C_2$-$C_{30}$ hetero aromatic ring system refers to an aromatic system including one or more aromatic rings that have one or more hetero atoms selected from N, O, P and S, wherein, in the one or more aromatic rings, the other ring atoms are carbon atoms (C). In this regard, when the unsubstituted $C_2$-$C_{30}$ hetero aromatic ring system includes two or more rings, the two or more rings may be fused together or connected to each other through a single bond. In the unsubstituted $C_2$-$C_{30}$ hetero aromatic ring system, one or more hydrogen atoms may be substituted with the substituents which have been described with the unsubstituted $C_1$-$C_{30}$ alkyl group. Specifically, unlimited examples of the substituted or unsubstituted $C_2$-$C_{30}$ hetero aromatic ring system and unlimited examples of the substituent thereof have already been described above.

In certain embodiments, the unsubstituted $C_5$-$C_{30}$ aryl group refers to a monovalent group including a carbocyclic aromatic system having one or more aromatic rings and 5-30 carbon atoms, and the unsubstituted $C_5$-$C_{30}$ arylene group refers to a divalent group including a carbocyclic aromatic system having one or more aromatic rings and 5-30 carbon atoms. When the unsubstituted $C_5$-$C_{30}$ aryl group and the unsubstituted $C_5$-$C_{30}$ arylene group include two or more rings, the two or more rings may be fused together or connected to each other through a single bond. In each of the unsubstituted $C_5$-$C_{30}$ aryl group and the unsubstituted $C_5$-$C_{30}$ arylene group, one or more hydrogen atoms may be substituted with the substituents which have been described with the unsubstituted $C_1$-$C_{30}$ alkyl group.

Examples of substituted or unsubstituted $C_5$-$C_{30}$ aryl groups include: phenyl groups; $C_1$-$C_{10}$ alkylphenyl groups such as ethylphenyl groups, $C_1$-$C_{10}$ alkylbiphenyl groups such as ethylbiphenyl groups, halophenyl groups such as o-, m- and p-fluorophenyl groups or dichlorophenyl groups, dicyanophenyl groups, trifluoromethoxyphenyl groups, o-, m-, and p-tolyl groups, o-, m- and p-cumenyl groups, mesityl groups, phenoxyphenyl groups, (α,α-dimethylbenzene)phenyl groups, (N,N'-dimethyl)aminophenyl groups, (N,N'-diphenyl)aminophenyl groups, pentalenyl groups, indenyl groups, naphthyl groups, halonaphthyl groups such as fluoronaphthyl groups, $C_1$-$C_{10}$ alkylnaphthyl groups such as methylnaphthyl groups, $C_1$-$C_{10}$ alkoxynaphthyl groups such as methoxynaphthyl groups, anthracenyl groups, azulenyl groups, heptarenyl groups, acenaphthylenyl groups, phenalenyl groups, fluorenyl groups, anthraquinolyl groups, methylanthryl groups, phenanthryl groups, triphenylene groups, pyrenyl groups, chrysenyl groups, ethyl-chrysenyl groups, picenyl groups, perylenyl groups, chloroperilenyl groups, pentaphenyl groups, pentacenyl groups, tetraphenylenyl groups, hexaphenyl groups, hexacenyl groups, rubicenyl groups, coroneryl groups, trinaphthylenyl groups, heptaphenyl groups, heptacenyl groups, pyranthrenyl groups, and ovalenyl groups. Examples of substituted or unsubstituted $C_5$-$C_{30}$ arylene groups may be easily recognized with reference to the examples of substituted or unsubstituted $C_5$-$C_{30}$ arylene groups.

In certain embodiments, the unsubstituted $C_2$-$C_{30}$ hetero aryl group refers to a monovalent group including one or more aromatic rings that has one or more hetero atoms selected from N, O, P and S, wherein, in the one or more aromatic rings, the other ring atoms are carbon atoms (C); and the unsubstituted $C_2$-$C_{30}$ hetero arylene group refers to a bivalent group including one or more aromatic rings that has one or more hetero atoms selected from N, O, P and S, wherein, in the one or more aromatic rings, the other ring atoms are carbon atoms (C). In this regard, if the unsubstituted $C_2$-$C_{30}$ hetero aryl group or the unsubstituted $C_2$-$C_{30}$ hetero arylene group includes two or more rings, the two or more rings may be fused together or connected to each other through a single bond. In each of the unsubstituted $C_2$-$C_{30}$ hetero aryl group and the unsubstituted $C_2$-$C_{30}$ hetero arylene group, one or more hydrogen atoms may be substituted with the substituents which have been described with the unsubstituted $C_1$-$C_{30}$ alkyl group.

Examples of suitable unsubstituted $C_2$-$C_{30}$ hetero aryl groups include pyrazolyl groups, imidazolyl groups, oxazolyl groups, thiazolyl groups, triazolyl groups, tetrazolyl groups, oxadiazolyl groups, pyridinyl groups, pyridazinyls, pyrimidinyl groups, triazinyl groups, carbazolyl groups, indolyl groups, quinolinyl groups, and isoquinolinyl groups. Examples of suitable substituted or unsubstituted $C_2$-$C_{30}$ hetero arylene groups may be easily recognized with reference to examples of substituted or unsubstituted $C_5$-$C_{30}$ arylene groups.

The compound represented by Formula 1 may be prepared using various known methods, which would be obvious to one of ordinary skill in the art.

For example, the compound represented by Formula 1 can be obtained by reacting the compound represented by Formula 3 with the compound represented by Formula 4:

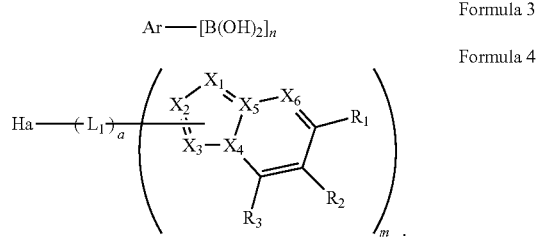

In Formulae 3 and 4, Ar, $X_1$ through $X_6$, $R_1$ through $R_3$, $L_1$, a, m and n have already been defined. In Formula 4, Ha may be a halogen atom. The compound represented by Formula 1 can be obtained through a Suzuki reaction between the compound represented by Formula 3 and the compound represented by Formula 4.

The light-efficiency-improvement layer 18 including the compound represented by Formula 1 has a high refractive index, and thus, light efficiency, specifically external luminescent efficiency, of the OLED 10 is relatively high. For example, the light-efficiency-improvement layer 18 may have a refractive index of 1.8 or more, specifically 1.9 or more, at a wavelength of about 630 nm.

In general, an organic light emitting diode includes a plurality of layers formed of various materials. Accordingly, at least some of the light generated in an organic layer may be reflected due to total internal reflection while passing through the layers and thus, may not be emitted outside the organic light emitting diode. Where the external luminescent efficiency of the organic light emitting diode is low, even when the light conversion efficiency in the organic layer is high, the entire light efficiency of the organic light emitting diode can be relatively low. However, when light generated in the organic layer 15 is emitted outside the organic light emitting diode through the second electrode 17 and the light-efficiency-improvement layer 18, the light-efficiency-improvement layer 18 may increase the external luminescent efficiency by constructive interference.

In FIG. 1, the light-efficiency-improvement layer 18 is disposed on a surface of the second electrode 17. However, various layers may be further disposed between the light-efficiency-improvement layer 18 and the second electrode 17. Meanwhile, although not illustrated in FIG. 1, a sealing layer for sealing the OLED 10 may be further disposed on the light-efficiency-improvement layer 18. As described above, the OLED 10 according to the current embodiment may have various modifications.

Figure 2:
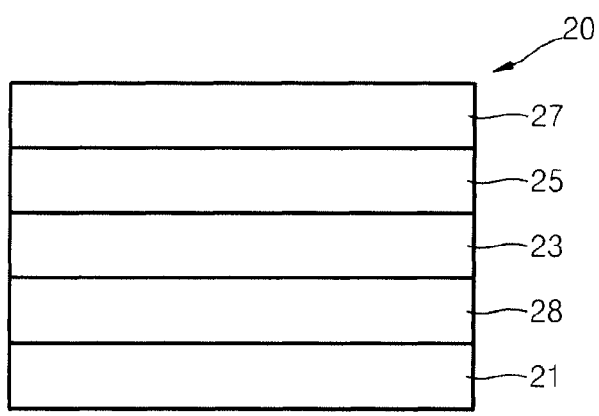
FIG. 2 is a schematic view of an organic light emitting diode according to another embodiment of the present invention.

FIG. 2 is a schematic view of an OLED 20 according to another embodiment of the present invention. Referring to FIG. 2, the organic light emitting diode 20 according to the current embodiment includes a substrate 21, a light-efficiency-improvement layer 28, a first electrode 23, an organic layer 25, and a second electrode 27 which are sequentially disposed in this order. The first electrode 23 has a first surface contacting with the organic layer 25 and a second surface being opposite to the organic layer 25. The light-efficiency-improvement layer 28 is formed on the second surface of the first electrode 23. The first electrode 23 is a transmission-type electrode, and light generated in the organic layer 25 is emitted outside the organic light emitting diode 20 through the first electrode 23 and the light-efficiency-improvement layer 28. The layers of the organic light emitting diode 20 are the same as the corresponding layers of the OLED 10, and thus detailed descriptions thereof will not be provided here. The light-efficiency-improvement layer 28 includes the compound represented by Formula 1 and thus, has a high refractive index. Accordingly, light generated in the organic layer 25 can be efficiently emitted outside the OLED 20 by constructive interference. Therefore, the light efficiency of the OLED 20 is relatively high.

Figure 3:
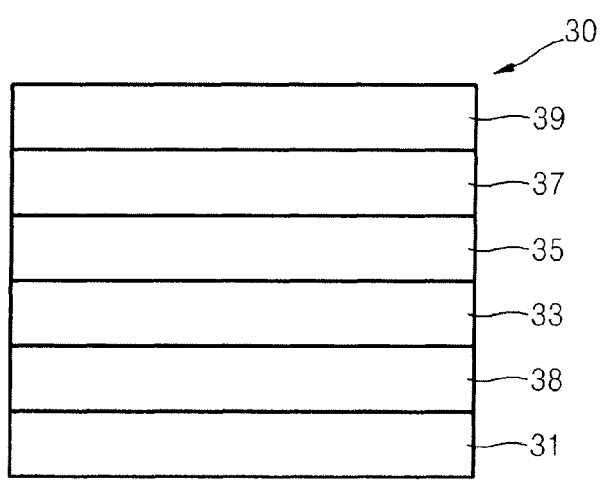
FIG. 3 is a schematic view of an organic light emitting diode according to another embodiment of the present invention.

FIG. 3 is a schematic view of an OLED 30 according to another embodiment of the present invention. Referring to FIG. 3, the OLED 30 according to the present embodiment includes a substrate 31, a first light-efficiency-improvement layer 38, a first electrode 33, an organic layer 35, a second electrode 37, and a second light-efficiency-improvement layer 39 which are sequentially disposed in this order. In the OLED 30, the first electrode 31 and the second electrode 37 are transmission-type electrodes. Accordingly, light generated in the organic layer 35 can be emitted outside the OLED 30 through the first electrode 31 and the first light-efficiency-improvement layer 38 and also through the second electrode 37 and the second light-efficiency-improvement layer 39. The layers of the OLED 30 are the same as the corresponding layers of the OLED 10, and thus detailed descriptions thereof will not be provided here. Each of the first light-efficiency-improvement layer 38 and the second light-efficiency-improvement layer 39 contain the compound represented by Formula 1 and thus, have a high refractive index. Accordingly, light generated in the organic layer 35 can be efficiently emitted outside the OLED 30 according to constructive interference. Therefore, the light efficiency of the OLED 30 is relatively high.

Meanwhile, in an OLED according to an embodiment of the present invention, an organic layer may be individually patterned corresponding to R, G and B pixels. Accordingly, the organic layer may include a red light emitting organic layer, a green light emitting organic layer, and a blue light emitting organic layer.

In this regard, a light-efficiency-improvement layer including the compound represented by Formula 1 described above may be a common layer with respect to the R, G and B pixels. When the light-efficiency-improvement layer is a common layer with respect to the R, G and B pixels, the thickness of the light-efficiency-improvement layer may be 500 Å to 800 Å. In other embodiments, the thickness may be 600 Å to 700 Å. If the thickness of the light-efficiency-improvement layer is within this range, the light efficiency of the organic light emitting diode may be improved.

Alternatively, the light-efficiency-improvement layer may include one or more layers selected from a light-efficiency-improvement layer-R, a light-efficiency-improvement layer-G, and a light-efficiency-improvement layer-B. That is, the light-efficiency-improvement layer can be individually patterned corresponding to the R, G and B pixels.

In the current specification, the term "light-efficiency-improvement layer-R" refers to a light-efficiency-improvement layer formed in an area corresponding to the R pixel.

In the current specification, the term "light-efficiency-improvement layer-G" refers to a light-efficiency-improvement layer formed in an area corresponding to the G pixel.

In the current specification, the term "light-efficiency-improvement layer-B" refers to a light-efficiency-improvement layer formed in an area corresponding to the B pixel.

The light-efficiency-improvement layer-R, the light-efficiency-improvement layer-G and the light-efficiency-improvement layer-B may be formed on at least one of the second surface of the first electrode and the second surface of the second electrode.

The light-efficiency-improvement layer-R, the light-efficiency-improvement layer-G and the light-efficiency-improvement layer-B may have the same or different thicknesses.

The present invention will now be described in further detail with reference to the following Synthesis Examples and Examples. These Synthesis Examples and Examples are for illustrative purposes only and are not intended to limit the scope of the present invention.

SYNTHESIS EXAMPLE 1

Synthesis of Compound 1

Compound 1 was synthesized according to Reaction Scheme 1:

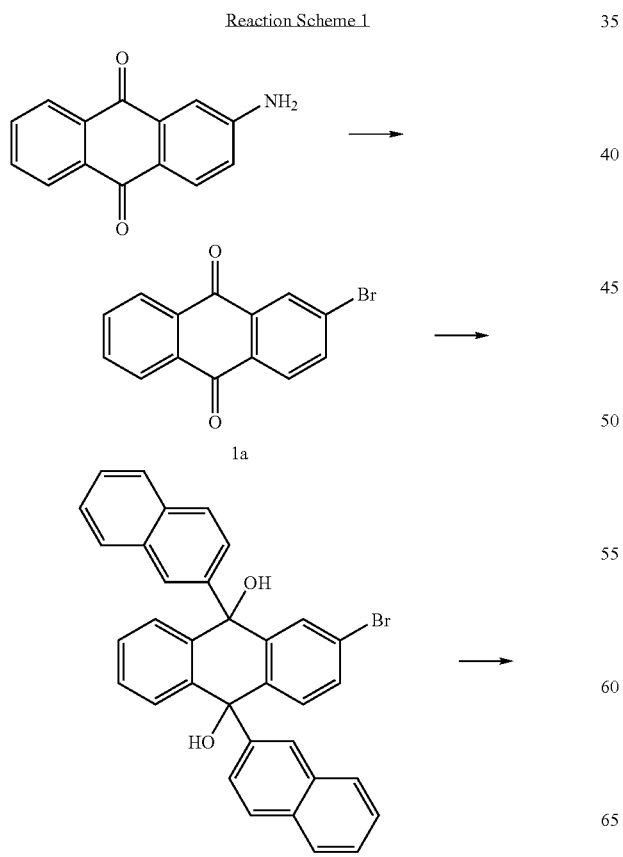

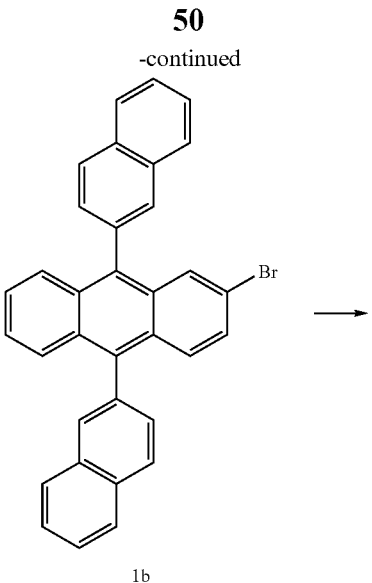

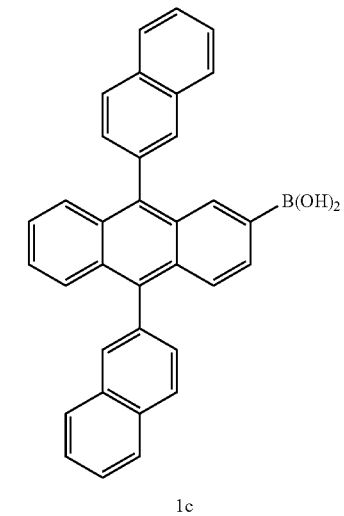

-continued

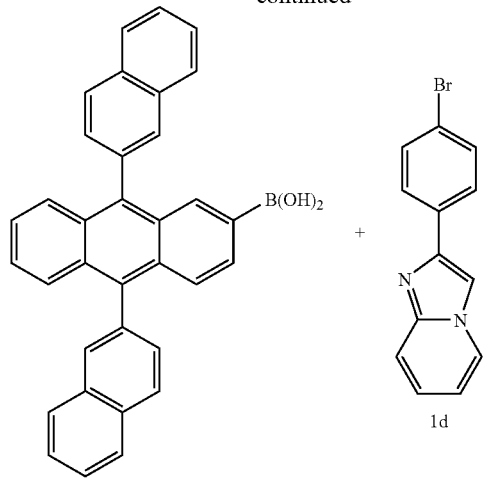

1c

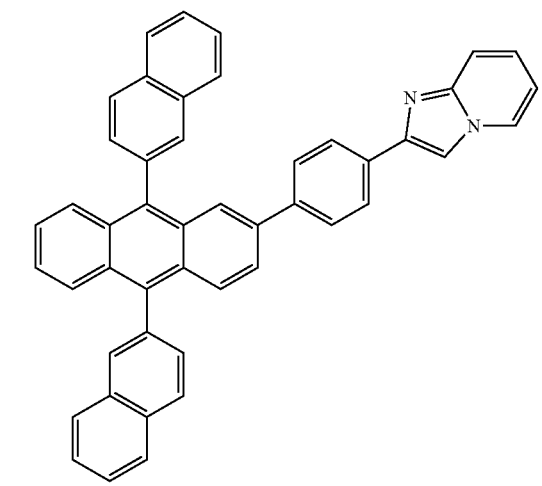

Compound 1

Synthesis of Intermediate 1a 10 g (44 mmol) of copper bromide and 8 g (35.8 mmol) of 2-aminoanthraqinone were added to 25 ml of a bromic acid and the mixture was heated at 65° C. until gas was not generated any more. Then the heated mixture was cooled to room temperature. 1000 ml of 20% hydrochloric acid solution was added to the reaction product and then dichloromethane was added thereto to extract an organic layer. The residual humidity of the organic layer was removed with anhydrous magnesium sulfate and then dried under a reduced pressure. The resultant reaction product was refined by column chromatography (dichloromethane:normalhexane=4:1), thereby obtaining 7.7 g of Intermediate 1a (Yield: 75%).

Synthesis of Intermediate 1b 10 g (34.8 mmol) of Intermediate 1a was added to 100 ml of tetrahydrofuran (THF) that had been dried in a nitrogen atmosphere and the temperature was decreased to −78° C., and then, 0.5M (10 mmol) of 2-naphthylmagnesiumbromide was slowly added thereto. The temperature was increased to room temperature and the resultant product was stirred for 3 hours. Then an ammonium chloride solution was added to the reaction product and then methylenechloride was added thereto to extract an organic layer. The organic layer was dried over anhydrous magnesium sulfate to remove the solvent used. The resultant mixture was dissolved with ethylether, and petroleum ether was added thereto and stirred, thereby obtaining a solid compound. The solid compound was dried in a vacuum condition to obtain 17.6 g of dinaphthyidialcohol.

17.6 g (32.4 mmol) of the dinaphthyldialcohol was dispersed in 200 ml of acetic acid in a nitrogen atmosphere and then, 53.4 g (330 mmol) of potassium iodide and 58 g (660 mmol) of sodium hypo phosphate hydrate were added thereto and stirred and refluxed for three hours. The resultant product was cooled to room temperature to generate a solid product. The solid product was filtered, washed with a mixture including water and methanol, and dried in a vacuum condition, thereby obtaining 11.3 g of Intermediate 1b that was light yellow in color.

Synthesis of Intermediate 1c 5 g (9.81 mmol) of Intermediate 1b was dissolved in 70 ml of THF that had been dried in a nitrogen atmosphere and then, 4.7 ml (11.8 mmol) of butyllithium was dropped thereto at −78° C. The resultant mixture was stirred at −78° C. for one hour and then 2.20 ml (29.4 mmol) of trimethylborate was added thereto. The temperature was increased to room temperature and left to sit for one hour. Then 2N hydrochloric acid solution was added to the resultant product and stirred for three hours to generate a solid compound. The solid compound was filtered and washed with toluene to obtain 3.27 g (Yield: 70%) of Intermediate 1c that was light yellow in color.

Synthesis of Intermediate 1d 3.39 g (35.98 mmol) of 2-aminopyridine and 10 g (35.98 mmol) of 2,4'-dibromoacetophenone were dissolved in 150 ml of ethanol and refluxed for 12 hours. The reaction product was cooled to room temperature to generate a white solid and the white solid was washed with a solution saturated with $NaHCO_3$ to obtain an organic layer. The residual humidity of the organic layer was removed with anhydrous magnesium sulfate, and then the resultant organic layer was dried under a reduced pressure and re-crystallized with dichloromethane and normalhexane to obtain 8.02 g (Yield: 82%) of Intermediate 1d having a plate crystalline structure.

Synthesis of Compound 1

1.85 g (3.90 mmol) of Intermediate 1c and 1 g (3.90 mmol) of Intermediate 1d were added to a solvent mixture including 2.7 g (19.5 mmol) of potassium carbonate solution and THF, and then 225 mg (0.196 mmol) of $Pd(PPh_3)_4$ was added thereto while stirring and the resultant mixture was refluxed for 6 hours. Then the reaction product was cooled to generate a solid compound. The solid compound was filtered and washed with water, ethanol, and THF to obtain 1.73 g (Yield: 71%) of Compound 1 that was light yellow powder. The resulting compound was evaluated by NMR analysis with the following results: 1H NMR (400 MHz, $CDCl_3$) 8.13-8.04 (7H), 8.01 (1H), 7.97-7.92 (4H), 7.86-7.82 (2H), 7.75 (2H), 7.71-7.58 (10H), 7.32 (2H), 7.15 (1H), 6.75 (1H)

SYNTHESIS EXAMPLE 2

Synthesis of Compound 2

Compound 2 was synthesized according to Reaction Scheme 2:

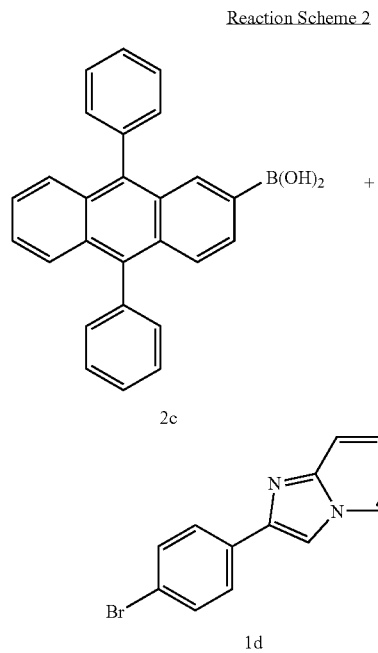

Compound 2 was prepared in the same manner as in Synthesis Example 1, except that Intermediate 2c was used instead of Intermediate 1c, wherein Intermediate 2c was prepared using phenylmagnesiumbromide instead of 2-naphthylmagnesiumbromide that was used to obtain Intermediates 1b and 1c in Synthesis Example 1. 4.6 g (Yield: 73%) of Compound 2 that was yellow powder was obtained through a Suzuki reaction between 5 g (13.36 mmol) of Intermediate 2c and 3.32 g (12.15 mmol) of Intermediate 1d. The resulting compound was evaluated by NMR analysis with the following results: 1H NMR (400 MHz, CDCl$_3$) 8.11 (1H), 7.99 (2H), 7.95 (1H), 7.86 (1H), 7.64 (1H), 7.73-7.70 (2H), 7.69 (1H), 7.66-7.61 (7H), 7.58 (2H), 7.56-7.50 (4H), 7.34 (2H), 7.17 (1H), 6.78 (1H)

SYNTHESIS EXAMPLE 3

Synthesis of Compound 3

Compound 3 was synthesized according to Reaction Scheme 3:

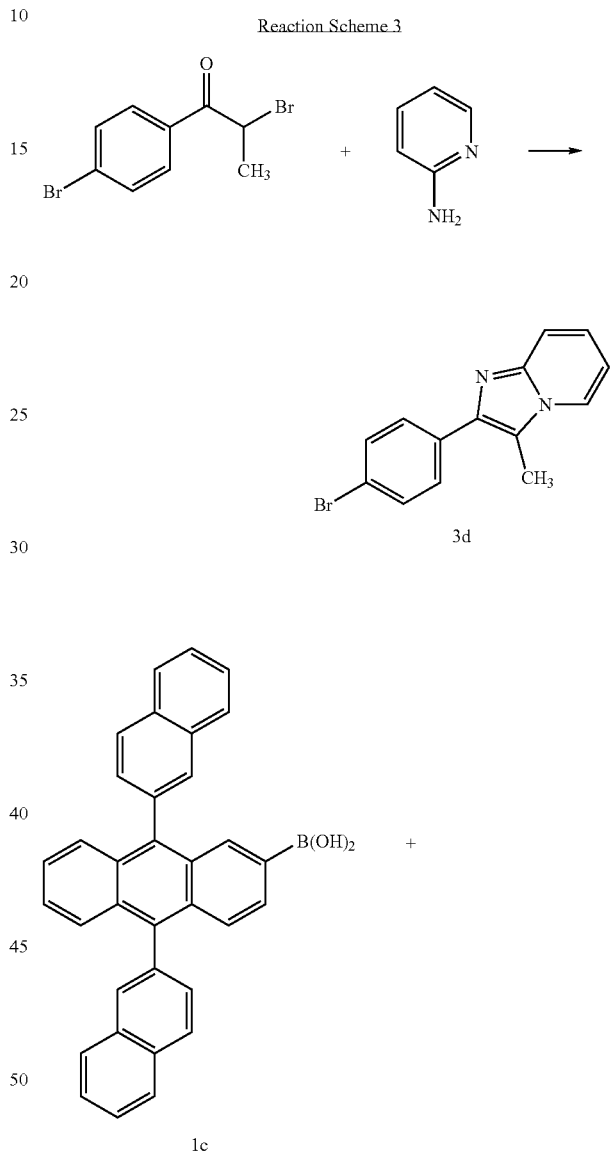

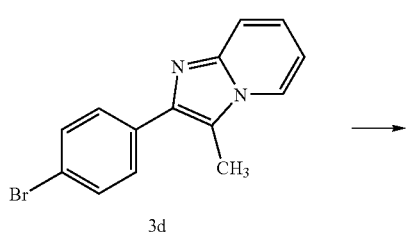

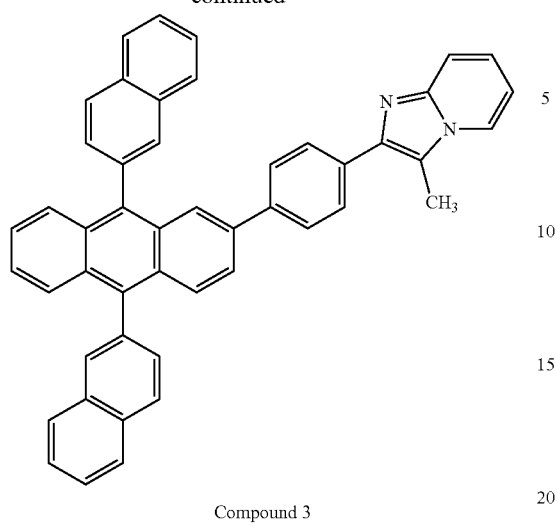

Compound 3

Compound 3 was prepared in the same manner as in Synthesis Example 1, except that Intermediate 3d was used instead of Intermediate 1d, wherein Intermediate 3d was prepared using 2,4'-diboromopropiophenone instead of 2,4'-dibromoacetophenone that was used to prepare Intermediate 1d. 4.15 g (Yield: 68%) of Compound 3 that was yellow powder was obtained through a Suzuki reaction between 5 g (10.54 mmol) of Intermediate 1c and 2.75 g (9.58 mmol) of Intermediate 3d. The resulting compound was evaluated by NMR analysis with the following results: 1H NMR (400 MHz, CDCl$_3$) 8.12 (2H), 8.07-8.02 (5H), 7.97-7.95 (2H), 7.89-7.84 (2H), 7.80-7.71 (4H), 7.70-7.66 (3H), 7.63-7.60 (7H), 7.32 (2H), 7.15 (1H), 6.83 (1H), 2.62 (3H)

SYNTHESIS EXAMPLE 4

Synthesis of Compound 4

Compound 4 was synthesized according to Reaction Scheme 4:

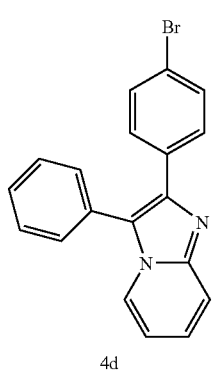

4d

Reaction Scheme 4

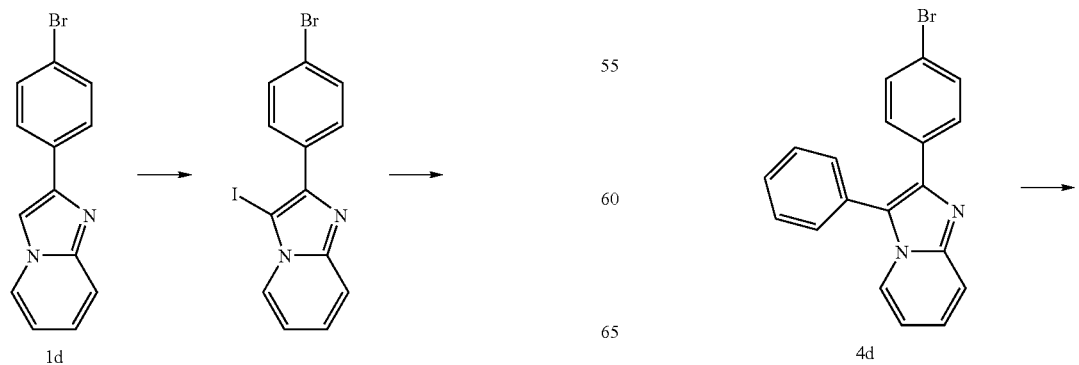

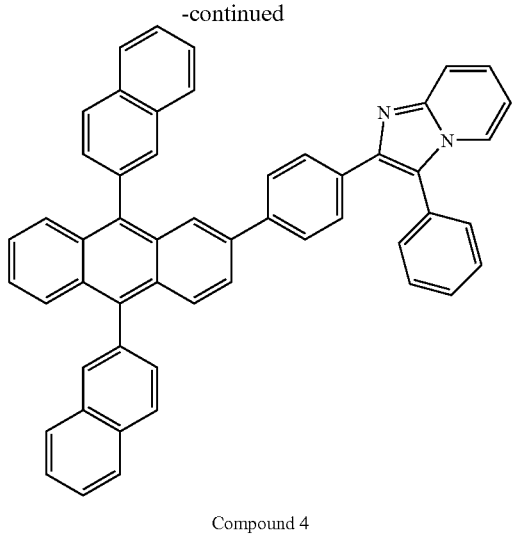

Compound 4

Synthesis of Intermediate 4d 5 g (18.3 mmol) of Intermediate 1d (see Synthesis Example 1) and 4.12 g (18.3 mmol) of N-iodosuccinimide (NIS) were dissolved in an acetonitrile solvent and stirred at room temperature for 1 hour, and then 100 ml of chloroform was added thereto. Then the reaction product was washed with 10% sodium hydroxide solution and then washed with a sodium thiosulfuric acid-saturated solution and water. The resultant product was dried over anhydrous magnesium sulfate and filtered to remove the solvent used, thereby obtaining a solid product. The solid product was filtered and washed with methanol to obtain 5.8 g (Yield: 79%) of an iodine compound. The iodine compound and 1.76 g (14.5 mmol) of phenyl boronic acid were added to a solvent mixture including 10 g of potassium carbonate solution and THF, and then 335 mg of Pd(PPh$_3$)$_4$ was added thereto while stirring. The resultant mixture was refluxed for 24 hours. Dichloromethane was added to the reaction solution to extract an organic layer, and the residual humidity of the organic layer was removed with anhydrous magnesium sulfate and the resultant organic layer was dried under a reduced pressure. The resultant product was refined by column chromatography (ethylacetate:normalhexane=2:3) to obtain 2.93 g (Yield: 58%) of Intermediate 4d.

Synthesis of Compound 4

Compound 4 was prepared in the same manner as in the method of preparing Compound 1 of Synthesis Example 1, except that Intermediate 4d was used instead of Intermediate 1d of Synthesis Example 1. 9.72 g (Yield: 73%) of Compound 4 that was light yellow powder was obtained through a Suzuki reaction between 10 g (21.08 mmol) of Intermediate 1c and 6.69 g (19.16 mmol) of Intermediate 4d. The resulting compound was evaluated by NMR analysis with the following results: 1H NMR (400 MHz, CDCl$_3$) 8.08 (1H), 8.03-8.01 (2H), 7.97-7.88 (3H), 7.81 (1H), 7.74-7.58 (12), 7.51-7.40 (10), 7.29-7.23 (3H), 7.15 (1 H), 6.69 (1H)

SYNTHESIS EXAMPLE 5

Synthesis of Compound 7

Compound 7 was synthesized according to Reaction Scheme 5:

Reaction Scheme 5

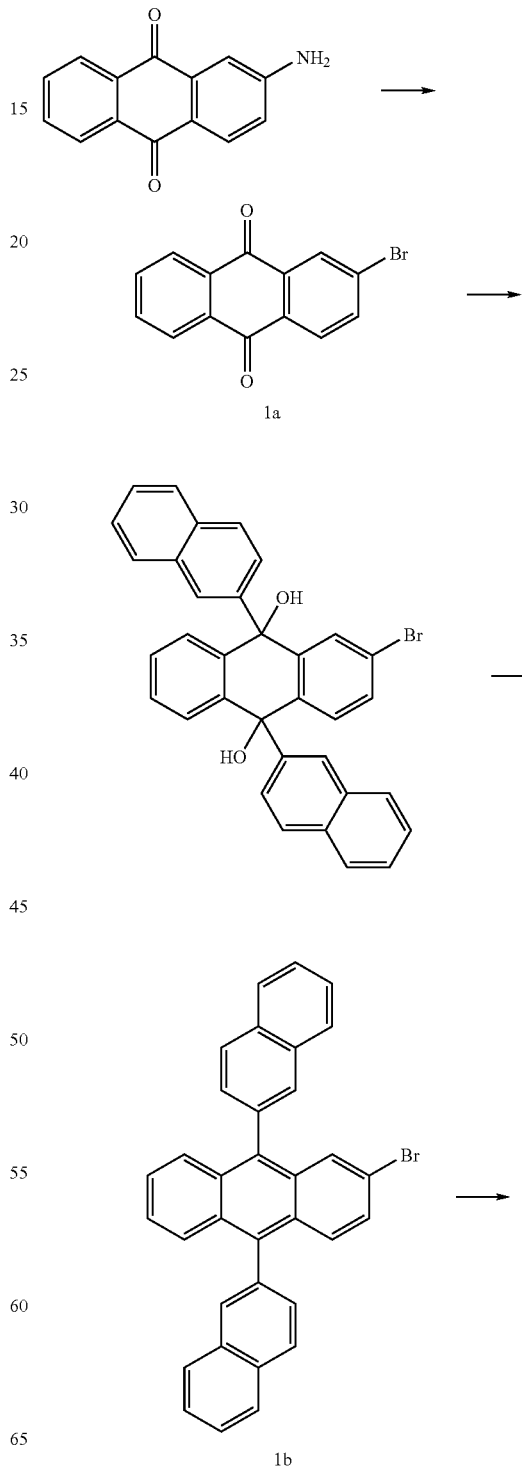

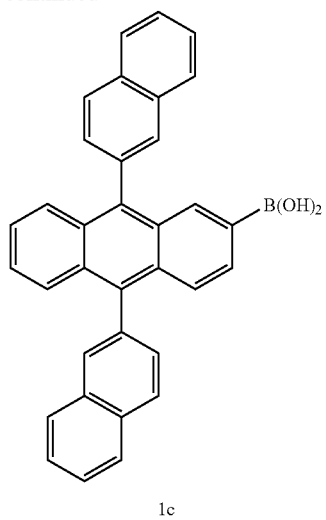

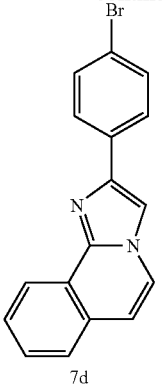

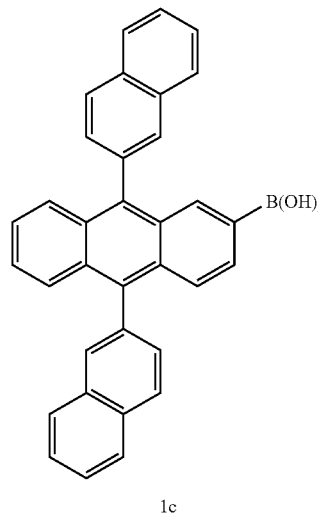

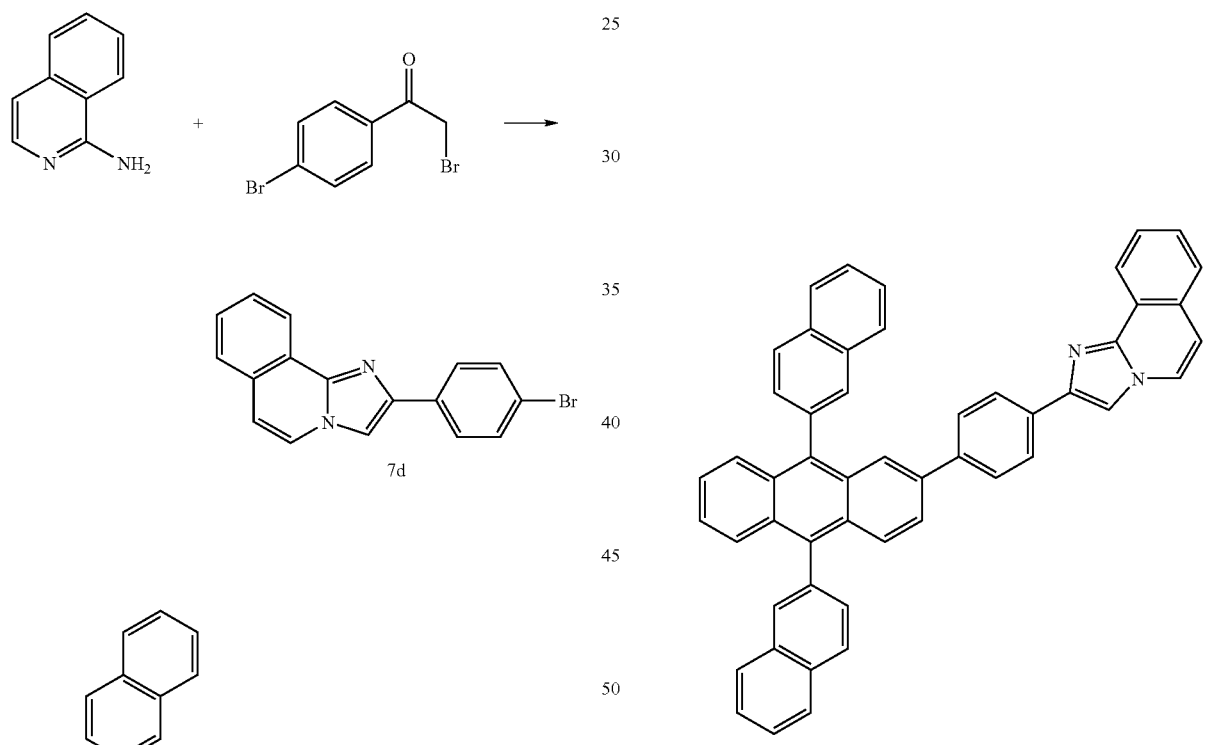

Compound 7

Compound 7 was prepared in the same manner as in Synthesis Example 1, except that Intermediate 7d was used instead of Intermediate 1d, wherein Intermediate 7d was prepared using 1-aminoisoquinoline instead of 2-aminopyridine. 9.03 g (Yield: 70%) of Compound 7 that was light yellow powder was prepared through a Suzuki reaction between 10 g (21.08 mmol) of Intermediate 1c and 6.19 g (19.16 mmol) of Intermediate 7d. The resulting compound was evaluated by NMR analysis with the following results: 1H NMR (400 MHz, CDCl3) 8.69 (1H), 8.12 (2H), 8.07-8.02 (5H), 7.99-7.95 (4H), 7.89-7.84 (2H), 7.79-7.75 (3H), 7.71-7.65 (4H), 7.64-7.54 (8H), 7.33 (2H), 7.02 (1H)

SYNTHESIS EXAMPLE 6

Synthesis of Compound 11

Compound 11 was synthesized according to Reaction Scheme 6:

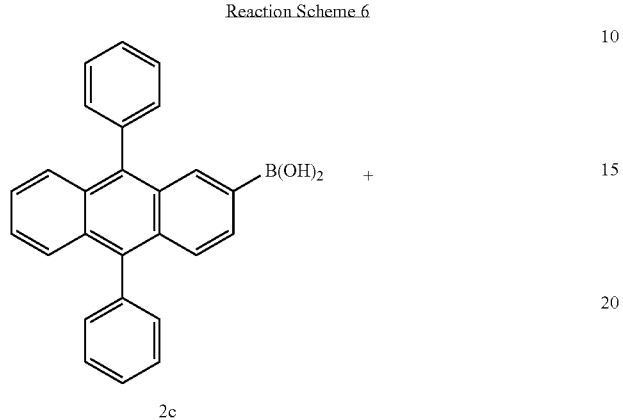

Compound 11 was prepared using Intermediate 2c prepared in the same manner as in Synthesis Example 2 and Intermediate 3d prepared in the same manner as in Synthesis Example 3. 4.72 g (Yield: 72%) of Compound 11 that was light yellow powder was obtained through a Suzuki reaction between Intermediate 2c 5 g (13.36 mmol) and 3.49 g (12.15 mmol) of Intermediate 3d. The resulting compound was evaluated by NMR analysis with the following results: 1H NMR (400 MHz, CDCl$_3$) 7.97 (1H), 7.91 (1H), 7.85 (2H), 7.80 (1H), 7.73-7.70 (2H), 7.69 (1H), 7.66-7.61 (7H), 7.58 (2H), 7.56-7.50 (4H), 7.34 (2H), 7.19 (1H), 6.86 (1H), 2.67 (3H)

SYNTHESIS EXAMPLE 7

Synthesis of Compound 12

Compound 12 was synthesized according to Reaction Scheme 7.

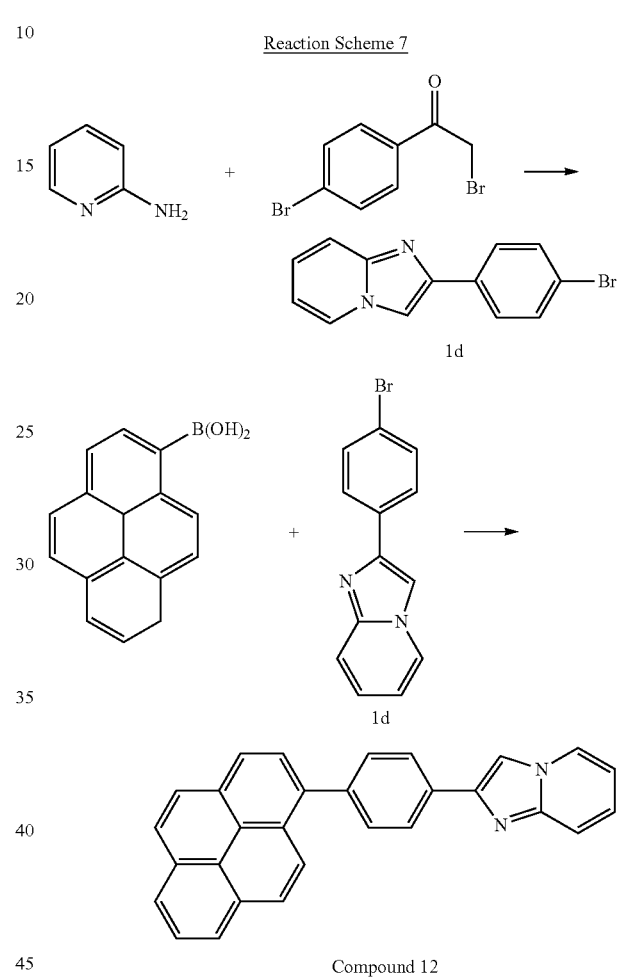

Intermediate 1d was prepared in the same manner as in Synthesis Example 1, and then, 5 g of Intermediate 1d, 4.5 g of pyrene-1-yl-1-boronic acid, 0.46 g of tetrakis(triphenylphosphine)paladium, 6 g of potassium carbonate were dissolved in a solvent mixture including 80 ml of THF and 80 ml of water. The resultant mixture was stirred at a reflux temperature for 18 hours. The reaction product was cooled to room temperature and a first organic layer was separated. 80 ml of dichloromethane was added to an aqueous layer to extract a second organic layer. The first and second organic layers were put together and dried with magnesium sulfate to remove the solvent used, thereby obtaining a crude product. The crude product was refined by silica-gel-column chromatography to obtain 5.5 g of Compound 12. The resulting compound was evaluated by NMR analysis with the following results: 1H NMR (DMSO-d6, 400 MHz) δ (ppm) 8.56 (1H, d), 8.51 (1H, s), 8.36 (1H, d), 8.31 (1H, d), 8.28 (1H, d), 8.22~8.18 (6H, m), 8.10~8.05 (2H, m), 7.70 (2H, d), 7.61 (1H, d), 7.26 (1H, t), 6.91 (1H, t)

SYNTHESIS EXAMPLE 8

Synthesis of Compound 14

Compound 14 was synthesized according to Reaction Scheme 8:

Reaction Scheme 8

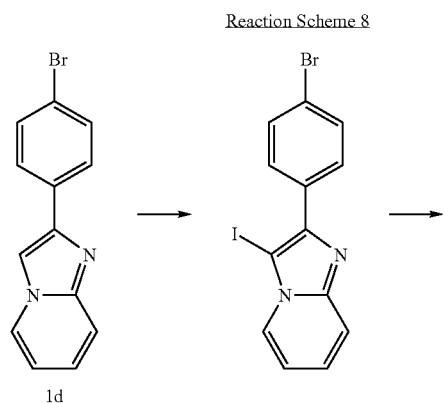

1d

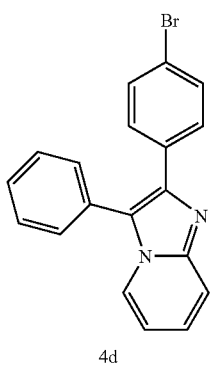

4d

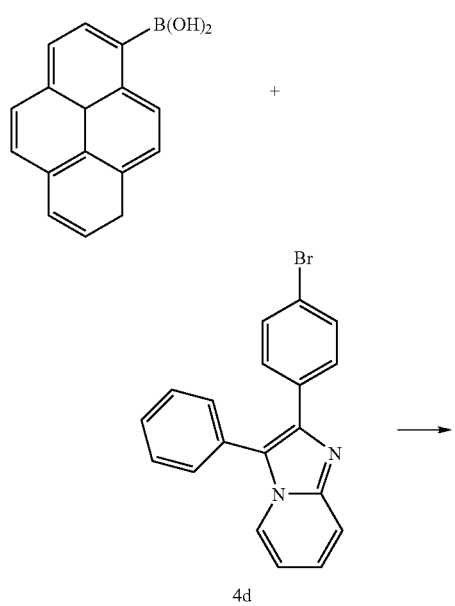

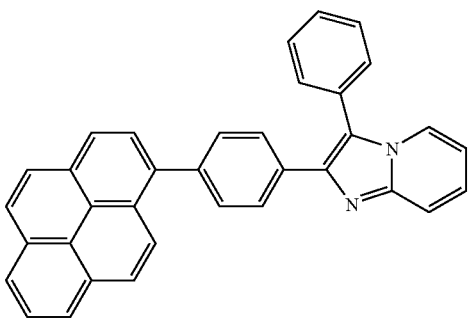

Compound 14

Intermediate 4d was prepared in the same manner as in Synthesis Example 4, and then, 2.9 g of Intermediate 4d, 2.0 g of pyrene-1-yl-1-boronic acid, 1.03 g of tetrakis(triphenylphosphine)palladium, and 13 g of potassium carbonate were dissolved in a solvent mixture including 40 ml of THF and 40 ml of water. The resultant mixture was stirred at a reflux temperature for 18 hours. The reaction product was cooled to room temperature and a first organic layer was separated. 40 ml of dichloromethane was added to an aqueous layer to extract a second organic layer. The first and second organic layers were put together and were dried with magnesium sulfate to remove the solvent used, thereby obtaining a crude product. The crude product was refined by silica-gel-column chromatography to obtain 3.0 g of Compound 14. The resulting compound was evaluated by NMR analysis with the following results: 1H NMR (DMSO-d6, 400 MHz) d (ppm) 8.24~8.13 (4H, m), 8.07 (2H, s), 8.01~7.97 (4H, m), 7.89 (2H, d), 7.73 (1H, d), 7.57 (7H, br s), 7.22 (1H, t), 6.74 (1H, t)

SYNTHESIS EXAMPLE 9

Synthesis of Compound 17

Compound 17 was synthesized according to Reaction Scheme 9:

Reaction Scheme 9

7d

-continued

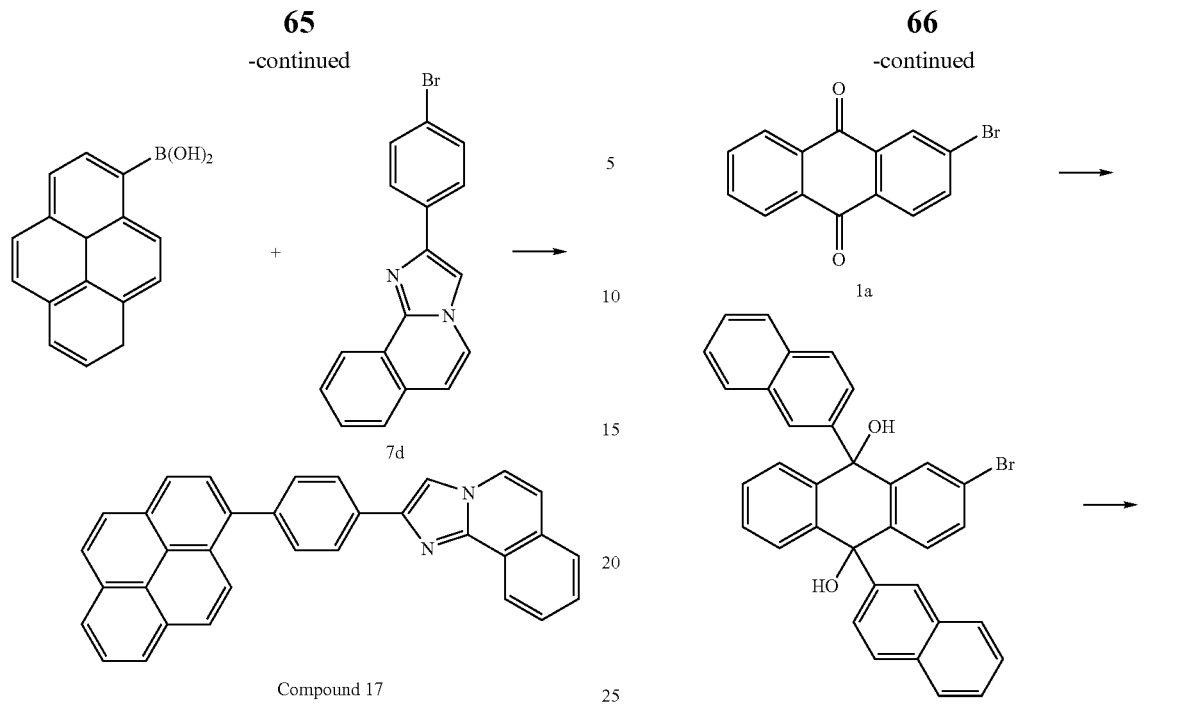

Compound 17

Intermediate 7d was prepared in the same manner as in Synthesis Example 5, and then 3.94 g of Intermediate 7d, 3.0 g of pyrene-1-yl-1-boronic acid, 0.7 g of tetrakis(triphenylphosphine)palladium, and 8 g of potassium carbonate were dissolved in a solvent mixture including 70 ml of THF and 70 ml of water. The resultant mixture was stirred at a reflux temperature for 18 hours. The reaction product was cooled to room temperature and a first organic layer was separated. 70 ml of dichloromethane was added to an aqueous layer to extract a second organic layer. The first and second organic layers were put together and were dried with magnesium sulfate to remove the solvent used, thereby obtaining a crude product. The crude product was refined by silica-gel-column chromatography to obtain 3.7 g of Compound 17. The resulting compound was evaluated by NMR analysis with the following results: 1H NMR (DMSO-d6, 400 MHz) d (ppm) 8.59 (1H, d), 8.56 (1H, s), 8.41 (1H, d), 8.40 (1H, d), 8.34 (1H, d), 8.32 (1H, d), 8.27~8.19 (6H, m), 8.13~8.10 (2H, m), 7.91 (1H, d), 7.75 (2H, d), 7.72~7.66 (2H, m), 7.31 (1H, d)

SYNTHESIS EXAMPLE 10

Synthesis of 36

Compound 36 was synthesized according to Reaction Scheme 10:

Reaction Scheme 10

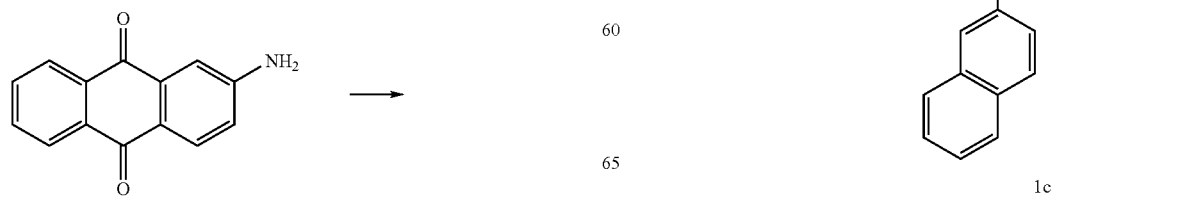

67

-continued

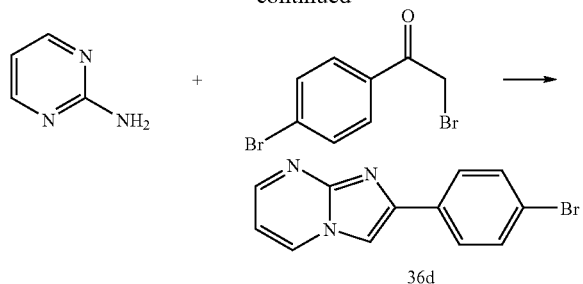

36d

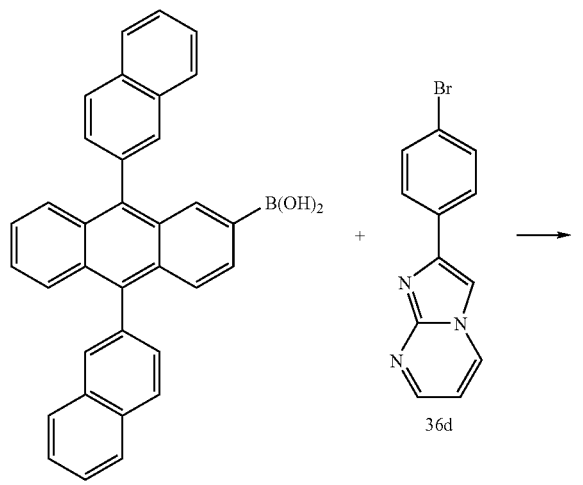

1c

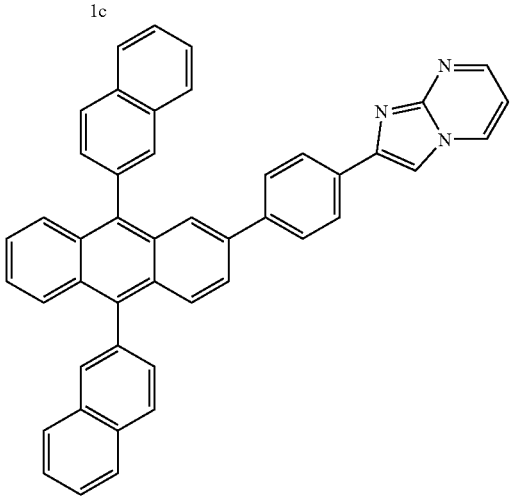

Compound 36

Intermediates 1a, 1b and 1c were synthesized in the same manner as in Synthesis Example 1.

Synthesis of Intermediate 36d 3.39 g (35.98 mmol) of 2-aminopyrimidine and 10 g (35.98 mmol) of 2,4'-dibromoacetophenone were dissolved in 150 ml of ethanol and the mixture was refluxed for 12 hours. The reaction product was cooled to room temperature to form a white solid. The white solid was filtered and washed with a NaHCO$_3$-saturated solution. The residual humidity of an organic layer was removed with anhydrous magnesium sulfate, and dried under a reduced pressure. Then the resultant organic layer was re-crystallized with dichloromethane and normalhexane, thereby obtaining 8.02 g (Yield: 82%) of Intermediate 36d having a plate crystalline state.

68

Synthesis of Compound 36

1.85 g (3.90 mmol) of Intermediate 1c and 1g (3.90 mmol) of Intermediate 36d were added to a solution mixture of 2.7 g (19.5 mmol) of potassium carbonate solution and THF, and then 225 mg (0.196 mmol) of Pd(PPh$_3$)$_4$ was added thereto while stirring. The resultant mixture was refluxed for 6 hours. The reaction product was cooled to room temperature to form a solid compound, and the solid compound was filtered and washed with water, ethanol, and toluene, thereby obtaining 1.73 g (Yield: 71%) of Compound 36. The resulting compound was evaluated by NMR analysis with the following results: 1H NMR (400 MHz, CDCl3) 8.51 (1H), 8.40 (1H), 8.12 (1H), 8.06-7.99 (5H), 7.96 (2H), 7.85 (1H), 7.78-7.59 (15H), 7.32 (2H), 6.84 (1H)

SYNTHESIS EXAMPLE 11

Synthesis of Compound 37

Compound 37 was prepared in the same manner as in Synthesis Example 10, except that phenylmagnesiumbromide was used instead of 2-naphthylmagnesiumbromide used to form Intermediate 1b in Synthesis Example 10. The resulting compound was evaluated by NMR analysis with the following results: 1H NMR (400 MHz, CDCl3) 8.54 (1H), 8.42 (1H), 8.07 (2H), 7.96 (1H), 7.83 (1H), 7.80 (1H), 7.73-7.48 (15H), 7.35 (2H), 6.87 (1H)

SYNTHESIS EXAMPLE 12

Synthesis of Compound 38

Compound 38 was prepared in the same manner as in Synthesis Example 10 for preparing Compound 36, except that phenylmagnesiumbromide was used instead of 2-naphthylmagnesiumbromide used to prepare Intermediate 1b in Synthesis Example 10 and 2,4'-dibromopropiophenone was used instead of 2,4'-dibromoacetophenone used to prepare Intermediate 36d. The resulting compound was evaluated by NMR analysis with the following results: 1H NMR (400 MHz, CDCl3) 8.54 (1H), 8.22 (1H), 7.97 (1H), 7.93 (2H), 7.70 (1H), 7.71-7.52 (15H), 7.35 (2H), 6.92 (1H), 2.73 (3H)

SYNTHESIS EXAMPLE 13

Synthesis of Compound 45

Compound 45 was synthesized according to Reaction Scheme 11:

Reaction Scheme 11

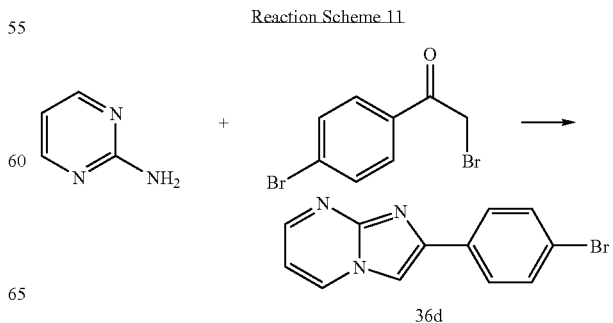

36d

-continued

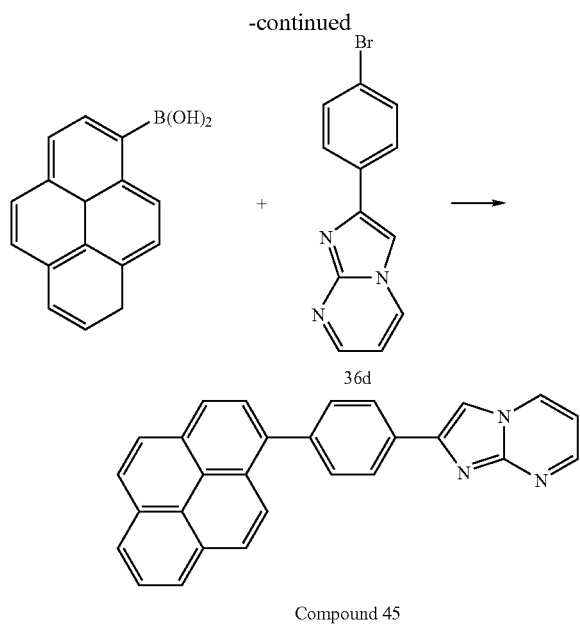

Compound 45

Intermediate 36d was prepared in the same manner as in Synthesis Example 10, and then 3.3 g of Intermediate 36d, 3 g of pyrene-1-yl-1-boronic acid, 0.7 g of tetrakis(triphenylphosphin)palladium, and 8 g of potassium carbonate were dissolved in a solvent mixture including 70 ml of THF and 70 ml of water. The resultant mixture was stirred at a reflux temperature for 18 hours. The reaction mixture was cooled to room temperature. Then a solid product in an organic layer was filtered and washed with a solvent mixture including water and THF, thereby obtaining 2.7 g of Compound 45. The resulting compound was evaluated by NMR analysis with the following results: 1H NMR (DMSO-d6, 400 MHz) d (ppm) 9.01 (1H, dd), 8.56 (1H, q), 8.51 (1H, s), 8.39 (1H, d), 8.32 (2H, q), 8.25~8.19 (6H, m), 8.10 (2H, t), 7.75 (2H, d), 7.09 (1H, dd)

EXAMPLE 1

Compound 1 prepared according to Synthesis Example 1 was vacuum-deposited on a substrate to form a light-efficiency-improvement layer having a thickness of 600 Å. Then an anode was disposed on the light-efficiency-improvement layer by forming a 15 Ω/cm (1200 Å) ITO. Then, m-MTDATA was vacuum-deposited on the anode to form an HIL having a thickness of 750 Å and then α-NPD was vacuum-deposited on the HIL to form an HTL having a thickness of 150 Å. An EML having a thickness of 300 Å was formed on the HTL by using 97 weight % of DSA constituting a host and 3 weight % of TBPe as a dopant. Then Alq3 was vacuum-deposited on the EML to form an ETL having a thickness of 200 Å. Then LiF was vacuum-deposited on the ETL to form an EIL having a thickness of 80 Å and then Al was vacuum-deposited on the EIL to form a cathode having a thickness of 3000 Å, thereby completing the manufacture of an organic light emitting diode.

EXAMPLES 2-9

Organic light emitting diodes were manufactured in the same manner as in Example 1, except that Compounds 2, 3, 4, 7, 11, 36, 37 and 38 were used instead of Compound 1 to form the light-efficiency-improvement layer.

COMPARATIVE EXAMPLE

An organic light emitting diode was manufactured in the same manner as in Example 1, except that Alq3 was used instead of Compound 1 to form the light-efficiency-improvement layer.

EVALUATION EXAMPLE 1

Efficiency (cd/A) of each organic light emitting diodes prepared according to Examples 1 through 9 and Comparative Example was measured with a PR650 Spectroscan Source Measurement Unit. (produced by PhotoResearch Co.). The results are shown in Table 1.

TABLE 1

| Example No. | Light-efficiency-improvement layer forming compound | Device efficiency (cd/A) |
| --- | --- | --- |
| Example 1 | Compound 1 | 3.8 |
| Example 3 | Compound 3 | 3.6 |
| Example 4 | Compound 4 | 3.6 |
| Example 5 | Compound 7 | 3.5 |
| Example 9 | Compound 38 | 3.5 |
| Example 7 | Compound 36 | 3.6 |
| Example 8 | Compound 37 | 3.6 |
| Comparative Example | Alq3 | 3.1 |

As described in the embodiments of the present invention, an organic light emitting diode including a light-efficiency-improvement layer containing the compound represented by Formula 1 has excellent light efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode comprising:
a substrate;
a first electrode defining first and second surfaces opposite one another, the second surface facing the substrate;
an organic layer facing the first surface of the first electrode;
a second electrode defining first and second surfaces opposite one another, the first surface facing the organic layer; and
a light-efficiency-improvement layer in contact with at least one of the second surface of the first electrode or the second surface of the second electrode and comprising a compound represented by Formula 1:

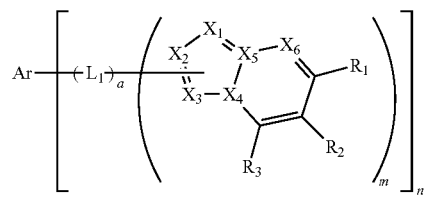

Formula 1 where

Ar is a substituted or unsubstituted $C_6$-$C_{30}$ aromatic ring system or a substituted or unsubstituted $C_2$-$C_{30}$ hetero aromatic ring system;

each $L_1$ is independently selected from the group consisting of substituted or unsubstituted $C_1$-$C_{30}$ alkylene groups, substituted or unsubstituted $C_6$-$C_{30}$ arylene groups, and substituted or unsubstituted $C_2$-$C_{30}$ hetero arylene groups;

$X_1$ is N, $CY_1$, or a carbon atom bonded to $L_1$ or Ar;
$X_2$ is N, $CY_2$, or a carbon atom bonded to $L_1$ or Ar;
$X_3$ is N, $CY_3$, or a carbon atom bonded to $L_1$ or Ar;
$X_4$ is N;
$X_5$ is a carbon atom;
$X_6$ is N or $CY_6$;

wherein one of $X_1$, $X_2$, and $X_3$ is a carbon atom bonded to $L_1$ or Ar;

each of $R_1$ through $R_3$, $Y_1$ through $Y_3$, and $Y_6$ is independently selected from the group consisting of a hydrogen atom, halogen atoms, a hydroxyl group, a cyano group, substituted or unsubstituted $C_1$-$C_{30}$ alkyl groups, substituted or unsubstituted $C_1$-$C_{30}$ alkoxy groups, substituted or unsubstituted $C_1$-$C_{30}$ acyl groups, substituted or unsubstituted $C_2$-$C_{30}$ alkenyl groups, substituted or unsubstituted $C_2$-$C_{30}$ alkynyl groups, substituted or unsubstituted $C_6$-$C_{30}$ aryl groups, and substituted or unsubstituted $C_2$-$C_{30}$ hetero aryl groups, wherein two or more adjacent elements selected from $R_1$ through $R_3$, $Y_1$ through $Y_3$, and $Y_6$ may be bonded to each other to form a saturated or unsaturated ring;

a is an integer from 0 to 10;
m is an integer from 1 to 5; and
n is an integer from 1 to 10.

2. The organic light emitting diode of claim 1, wherein Ar is selected from the group consisting of substituted or unsubstituted pentalenes, substituted or unsubstituted indenes, substituted or unsubstituted naphthalenes, substituted or unsubstituted azulenes, substituted or unsubstituted heptalenes, substituted or unsubstituted indacenes, substituted or unsubstituted acenaphthylenes, substituted or unsubstituted fluorenes, substituted or unsubstituted phenalenes, substituted or unsubstituted phenanthrenes, substituted or unsubstituted anthracenes, substituted or unsubstituted fluoranthenes, substituted or unsubstituted triphenylenes, substituted or unsubstituted pyrenes, substituted or unsubstituted chrysenes, substituted or unsubstituted naphthacenes, substituted or unsubstituted picenes, substituted or unsubstituted perylenes, substituted or unsubstituted pentaphenes, substituted or unsubstituted hexacenes, substituted or unsubstituted pyrroles, substituted or unsubstituted pyrazoles, substituted or unsubstituted imidazoles, substituted or unsubstituted imidazolines, substituted or unsubstituted pyridines, substituted or unsubstituted pyrazines, substituted or unsubstituted pyrimidines, substituted or unsubstituted indoles, substituted or unsubstituted purines, substituted or unsubstituted quinolines, substituted or unsubstituted phthalazines, substituted or unsubstituted indolizines, substituted or unsubstituted naphthyridines, substituted or unsubstituted quinazolines, substituted or unsubstituted cinnolines, substituted or unsubstituted indazoles, substituted or unsubstituted carbazoles, substituted or unsubstituted phenazines, substituted or unsubstituted phenanthridines, substituted or unsubstituted pyrans, substituted or unsubstituted chromenes, substituted or unsubstituted benzofurans, substituted or unsubstituted thiophenes, substituted or unsubstituted benzothiophenes, substituted or unsubstituted isothiazoles, and substituted or unsubstituted isoxazoles.

3. The organic light emitting diode of claim 1, wherein, when Ar is a substituted $C_6$-$C_{30}$ aromatic ring system or a substituted $C_2$-$C_{30}$ hetero aromatic ring system, a substituent is selected from the group consisting of substituted or unsubstituted $C_6$-$C_{14}$ aryl groups and substituted or unsubstituted $C_2$-$C_{14}$ hetero aryl groups.

4. The organic light emitting diode of claim 1, wherein, when Ar is a substituted $C_6$-$C_{30}$ aromatic ring system or a substituted $C_2$-$C_{30}$ hetero aromatic ring system, a substituent is selected from the group consisting of phenyl groups, halophenyl groups, $C_1$-$C_{10}$ alkylphenyl groups, $C_1$-$C_{10}$ alkoxyphenyl groups, naphthyl groups, halonaphthyl groups, $C_1$-$C_{10}$ alkylnaphthyl groups, $C_1$-$C_{10}$ alkoxynaphthyl groups, pyridinyl groups, halopyridinyl groups, $C_1$-$C_{10}$ alkylpyridinyl groups, $C_1$-$C_{10}$ alkoxypyridinyl groups, quinolinyl groups, haloquinolinyl groups, $C_1$-$C_{10}$ alkylquinolinyl groups, $C_1$-$C_{10}$ alkoxyquinolinyl groups, isoquinolinyl groups, haloisoquinolinyl groups, $C_1$-$C_{10}$ alkylisoquinolinyl groups, and $C_1$-$C_{10}$ alkoxyisoquinolinyl groups.

5. The organic light emitting diode of claim 1, wherein each $L_1$ is independently selected from the group consisting of substituted or unsubstituted $C_6$-$C_{14}$ arylene groups and substituted or unsubstituted $C_2$-$C_{14}$ hetero arylene groups.

6. The organic light emitting diode of claim 1, wherein each $L_1$ is independently selected from the group consisting of phenylene groups, halophenylene groups, $C_1$-$C_{10}$ alkylphenylene groups, $C_1$-$C_{10}$ alkoxyphenylene groups, naphthylene groups, halonaphthylene groups, $C_1$-$C_{10}$ alkylnaphthylene groups, and $C_1$-$C_{10}$ alkoxynaphthylene groups.

7. The organic light emitting diode of claim 1, wherein -$(L_1)_a$- is represented by any one formula selected from Formulae 2a through 2g:

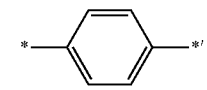

Formula 2a

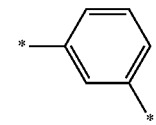

Formula 2b

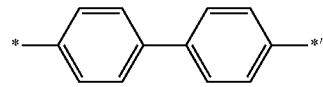

Formula 2c

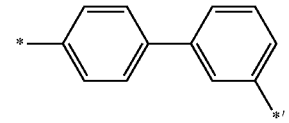

Formula 2d

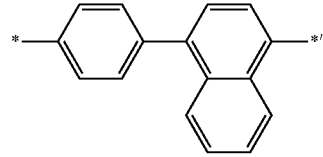

Formula 2e

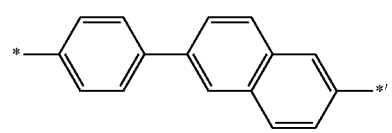

Formula 2f

-continued

Formula 2g

8. The organic light emitting diode of claim 1, wherein at least one of $X_1$, $X_4$ and $X_6$ is N.

9. The organic light emitting diode of claim 1, wherein each of $X_1$ and $X_4$ is N.

10. The organic light emitting diode of claim 1, wherein each of $X_1$, $X_4$ and $X_6$ is N.

11. The organic light emitting diode of claim 1, wherein each of $R_1$ through $R_3$, $Y_1$ through $Y_3$, and $Y_6$ is independently selected from the group consisting of a hydrogen atom, substituted or unsubstituted $C_1$-$C_{10}$ alkyl groups, substituted or unsubstituted $C_2$-$C_{10}$ alkenyl groups, substituted or unsubstituted $C_6$-$C_{14}$ aryl groups, and $C_2$-$C_{14}$ hetero aryl groups.

12. The organic light emitting diode of claim 1, wherein each of $R_1$ through $R_3$, $Y_1$ through $Y_3$, and $Y_6$ is independently selected from the group consisting of a hydrogen atom, $C_1$-$C_{10}$ alkyl groups, $C_1$-$C_{10}$ halo alkyl groups, $C_2$-$C_{10}$ alkenyl groups, $C_2$-$C_{10}$ halo alkenyl groups, phenyl groups, halophenyl groups, $C_1$-$C_{10}$ alkylphenyl groups, $C_1$-$C_{10}$ alkoxyphenyl groups, naphthyl groups, halonaphthyl groups, $C_1$-$C_{10}$ alkylnaphthyl groups, and $C_1$-$C_{10}$ alkoxynaphthyl groups.

13. The organic light emitting diode of claim 1, wherein n is 1 or 2.

14. The organic light emitting diode of claim 1, wherein the compound represented by Formula 1 is a compound represented by any one formula selected from Formulae 1A through 1X:

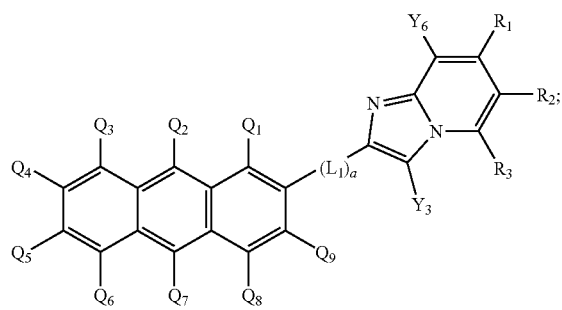

Formula 1A

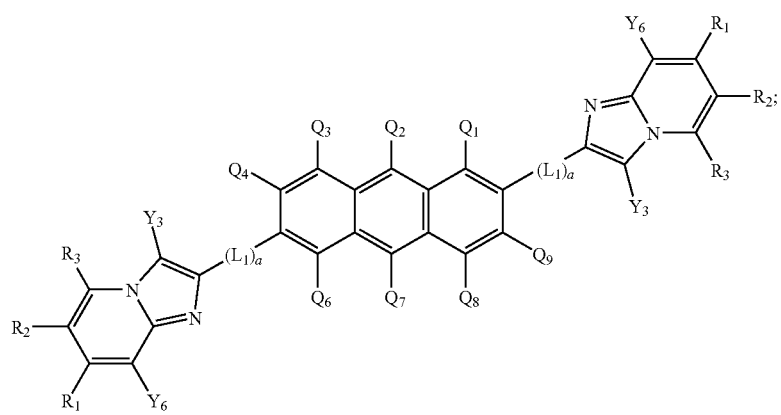

Formula 1B

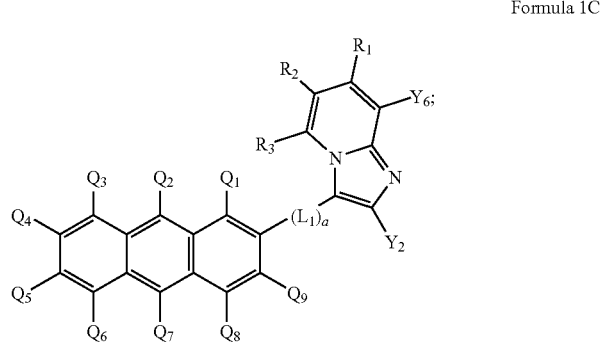

Formula 1C

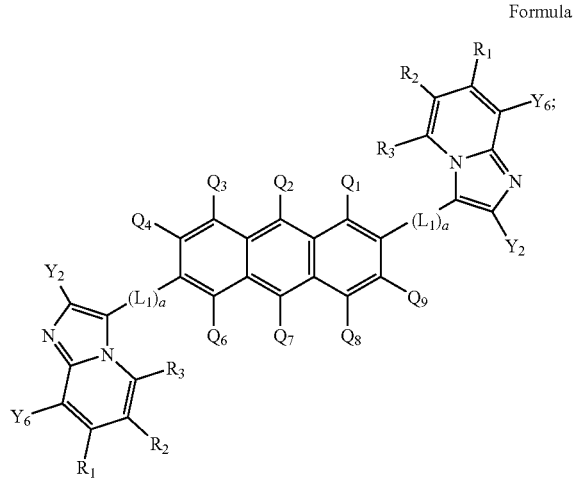

Formula 1D

-continued
Formula 1E
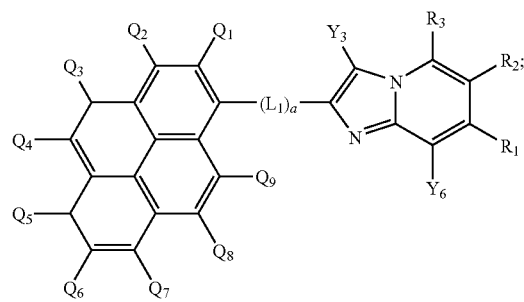
Formula 1F
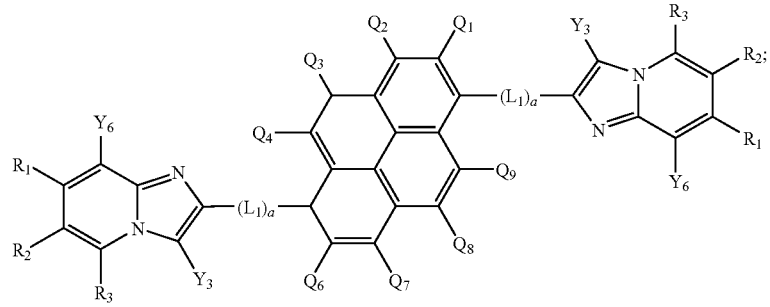
Formula 1G
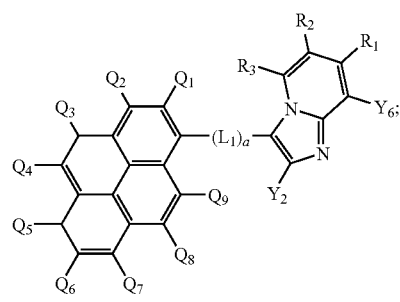
Formula 1H
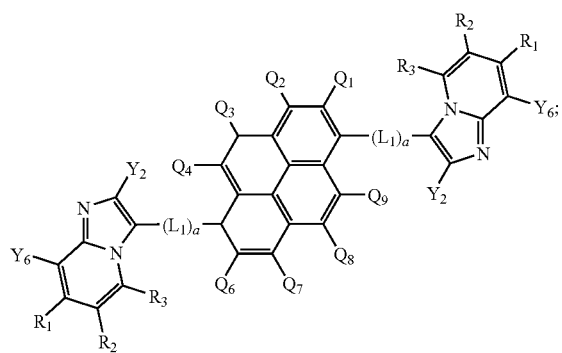
Formula 1I
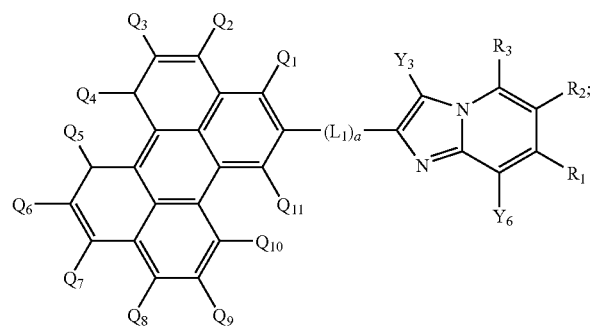
Formula 1J
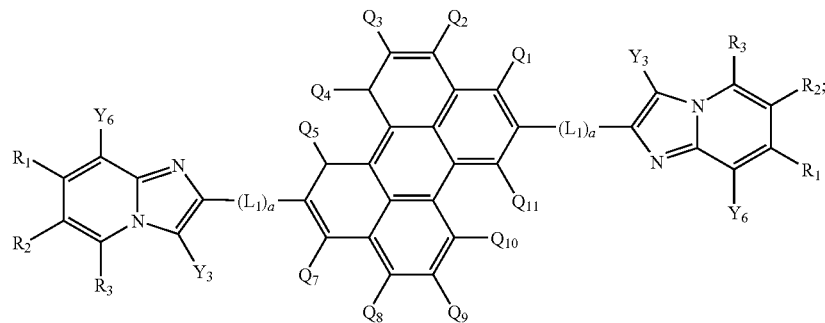

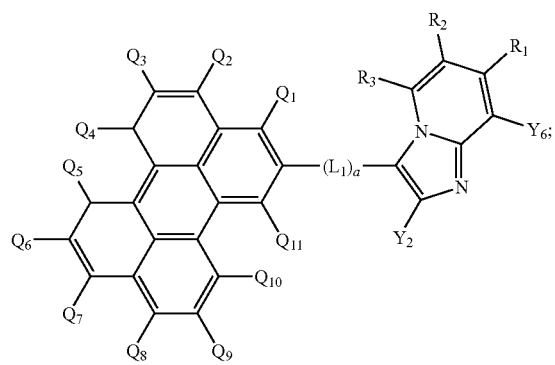
Formula 1K
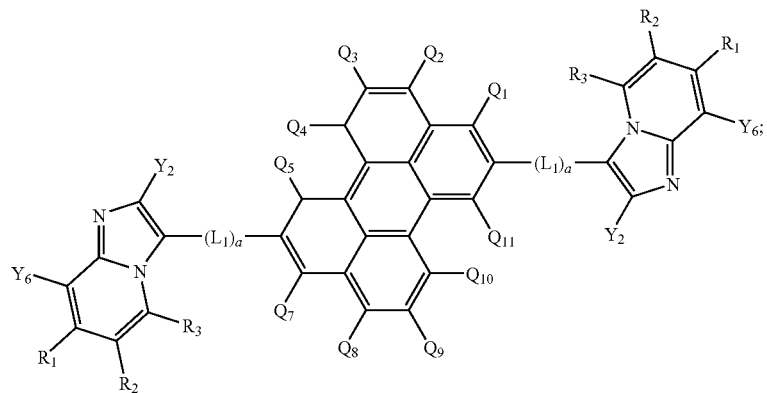
Formula 1L
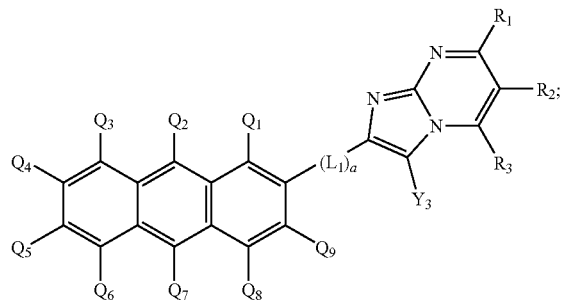
Formula 1M
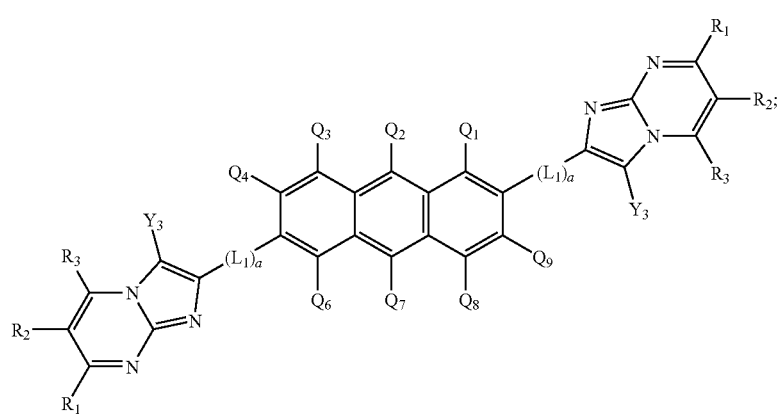
Formula 1N -continued
Formula 1O
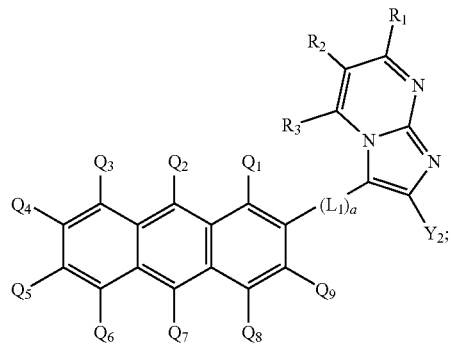
Formula 1P
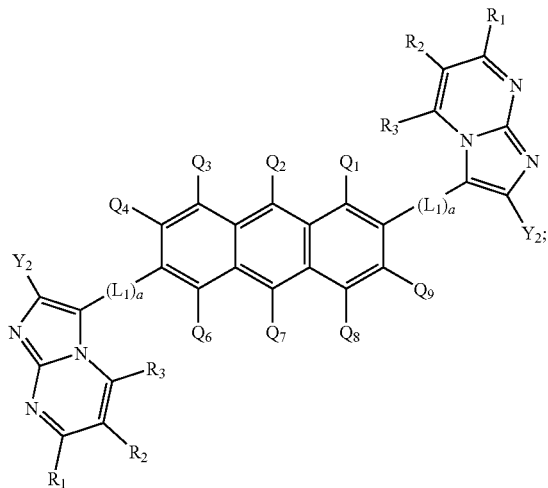
Formula 1Q
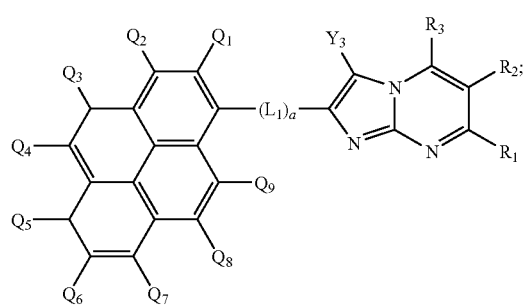
Formula 1R
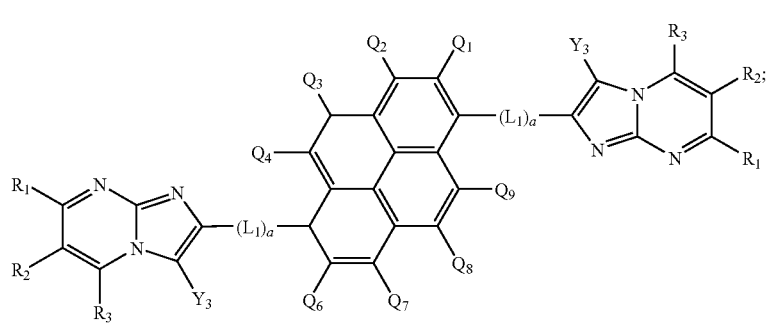
Formula 1S
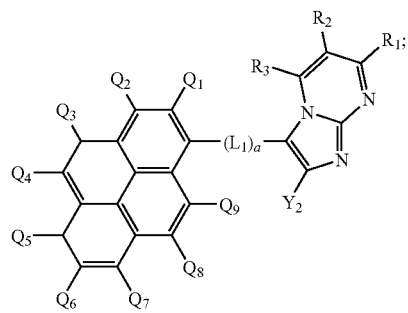
Formula 1T
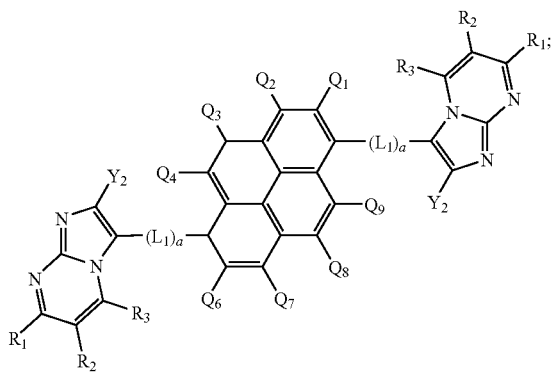

-continued
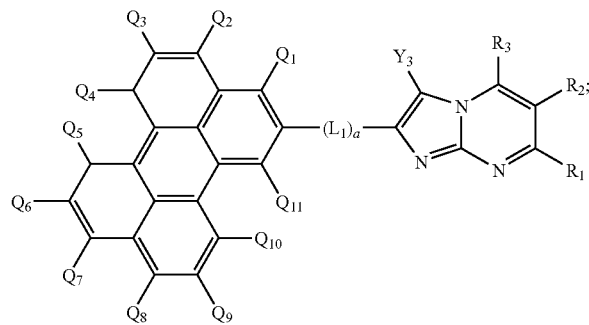
Formula 1U
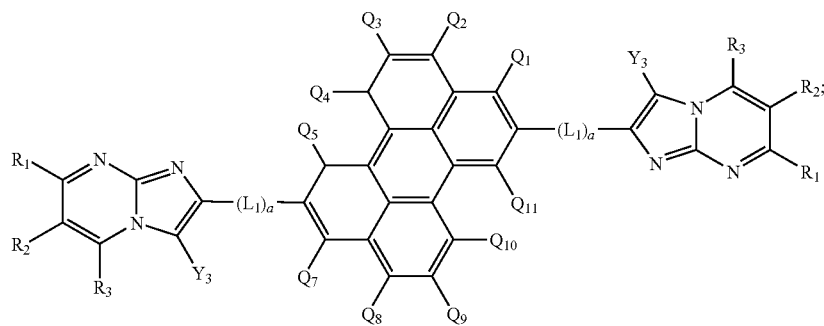
Formula 1V
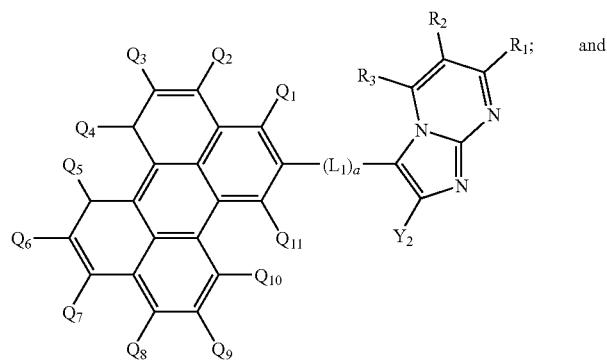
Formula 1W
and
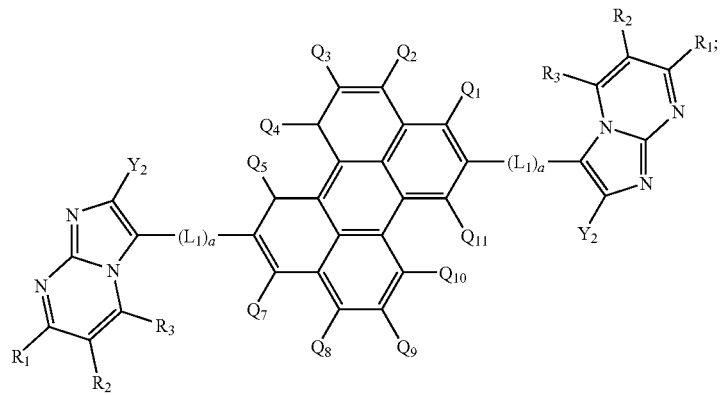
Formula 1X where
- each of $Q_1$ through $Q_{11}$ is independently selected from the group consisting of a hydrogen atom, substituted or unsubstituted $C_6$-$C_{14}$ aryl groups, and substituted or unsubstituted $C_2$-$C_{14}$ hetero aryl groups;
- each of $L_1$ is independently selected from the group consisting of substituted or unsubstituted $C_6$-$C_{14}$ arylene groups and substituted or unsubstituted $C_2$-$C_{14}$ hetero arylene groups;
- each of $R_1$, $R_2$, $R_3$, $Y_2$ and $Y_3$ is independently selected from the group consisting of a hydrogen atom, substituted or unsubstituted $C_1$-$C_{10}$ alkyl groups, substituted or unsubstituted $C_2$-$C_{10}$ alkenyl groups, substituted or unsubstituted $C_6$-$C_{14}$ aryl groups, and $C_2$-$C_{14}$ hetero aryl groups, wherein two or more adjacent elements selected from $R_1$ through $R_3$, $Y_2$, $Y_3$, and $Y_6$ may be bonded to each other to form a $C_6$-$C_{12}$ aromatic ring; and
- a is 1 or 2.

15. The organic light emitting diode of claim 14, wherein $Q_1$ through $Q_{11}$ are each independently a hydrogen atom, a phenyl group, a halophenyl group, a $C_1$-$C_{10}$ alkylphenyl group, a $C_1$-$C_{10}$ alkoxyphenyl group, a naphthyl group, a halonaphthyl group, a $C_1$-$C_{10}$ alkylnaphthyl group, a $C_1$-$C_{10}$ alkoxynaphthyl group, a pyridinyl group, a halopyridinyl group, a $C_1$-$C_{10}$ alkylpyridinyl group, a $C_1$-$C_{10}$ alkoxypyridinyl group, a quinolinyl group, a haloquinolinyl group, a $C_1$-$C_{10}$ alkylquinolinyl group, a $C_1$-$C_{10}$ alkoxyquinolinyl group, an isoquinolinyl group, a haloisoquinolinyl group, a $C_1$-$C_{10}$ alkylisoquinolinyl group, or a $C_1$-$C_{10}$ alkoxyisoquinolinyl group.

16. The organic light emitting diode of claim 1, wherein the second electrode is a transmission-type electrode and the light-efficiency-improvement layer is in contact with the second surface of the second electrode.

17. The organic light emitting diode of claim 1, wherein the first electrode is a transmission-type electrode and the light-efficiency-improvement layer is in contact with the second surface of the first electrode.

18. The organic light emitting diode of claim 1, wherein the first electrode and the second electrode are transmission-type electrodes and a light-efficiency-improvement layer is in contact with the second surface of the first electrode and a light-efficiency-improvement layer is in contact with the second surface of the second electrode.

19. The organic light emitting diode of claim 1, wherein the organic layer is individually formed corresponding to R, G and B pixels and the light-efficiency-improvement layer is a common layer with respect to the R, G and B pixels.

20. The organic light emitting diode of claim 1, wherein the organic layer is individually formed corresponding to R, G and B pixels and the light-efficiency-improvement layer comprises at least one layer selected from the group consisting of a light-efficiency-improvement layer-R formed corresponding to the R pixel, a light-efficiency-improvement layer-G formed corresponding to the G pixel, and a light-efficiency-improvement layer-B formed corresponding to the B pixel.

21. The organic light emitting diode of claim 20, wherein the light-efficiency-improvement layer comprises the light-efficiency-improvement layer-R, the light-efficiency-improvement layer-G, and the light-efficiency-improvement layer-B.

22. The organic light emitting diode of claim 21, wherein the light-efficiency-improvement layer-R, the light-efficiency-improvement layer-G and the light-efficiency-improvement layer-B have the same or different thicknesses.

* * * * *